(12) United States Patent
Mori et al.

(10) Patent No.: US 10,121,741 B2
(45) Date of Patent: Nov. 6, 2018

(54) SEMICONDUCTOR DEVICE, METHOD FOR MANUFACTURING THE SAME, METHOD FOR GENERATING MASK DATA, MASK AND COMPUTER READABLE RECORDING MEDIUM

(71) Applicant: Seiko Epson Corporation, Tokyo (JP)

(72) Inventors: Katsumi Mori, Sakata (JP); Kei Kawahara, Isahaya (JP); Yoshikazu Kasuya, Sakata (JP)

(73) Assignee: Seiko Epson Corporation (JP)

(*) Notice: Subject to any disclaimer, the term of this patent is extended or adjusted under 35 U.S.C. 154(b) by 72 days.

(21) Appl. No.: 15/441,635

(22) Filed: Feb. 24, 2017

(65) Prior Publication Data

US 2017/0162499 A1 Jun. 8, 2017

Related U.S. Application Data

(60) Division of application No. 15/242,885, filed on Aug. 22, 2016, now Pat. No. 9,978,737, which is a
(Continued)

(30) Foreign Application Priority Data

Mar. 17, 2000 (JP) ................................. 2000-075671

(51) Int. Cl.
*H01L 23/528* (2006.01)
*G06F 17/50* (2006.01)
*H01L 23/522* (2006.01)
*H01L 21/768* (2006.01)

(52) U.S. Cl.
CPC ........ *H01L 23/528* (2013.01); *G06F 17/5081* (2013.01); *H01L 21/76816* (2013.01);
(Continued)

(58) Field of Classification Search
CPC ............ H01L 23/528; H01L 21/76816; H01L 21/76819; H01L 21/76877; H01L 23/5226; G06F 17/5077; G06F 17/5081
See application file for complete search history.

(56) References Cited

U.S. PATENT DOCUMENTS 4,916,514 A 4/1990 Nowak
5,357,140 A 10/1994 Kozasa
(Continued)

FOREIGN PATENT DOCUMENTS

JP 04-218918 A 8/1992
JP 08-160590 A 6/1996
(Continued)

*Primary Examiner* — Stacy Whitmore
(74) *Attorney, Agent, or Firm* — Harness, Dickey & Pierce, P.L.C.

(57) ABSTRACT

A multilayer semiconductor device includes first wirings extending in a first direction and arranged adjacent to each other in a second direction. Dummy wirings are arranged between the first wirings and the second wiring at crossing points between first virtual linear lines extending in a third direction and second virtual linear lines extending in a fourth direction. The third and fourth directions are neither parallel nor orthogonal to the first and second directions. The dummy wirings have a first, a second, and a third dummy wiring. Centers of the second and third dummy wirings are nearest to a center of the first dummy wiring relative to others of the dummy wirings. The respective centers of the first, second, and third dummy wirings are aligned on a third virtual linear line extending in a fifth direction neither parallel to nor perpendicular to the first and second directions.

13 Claims, 16 Drawing Sheets

Related U.S. Application Data continuation of application No. 14/613,824, filed on Feb. 4, 2015, now Pat. No. 9,455,223, which is a continuation of application No. 14/136,692, filed on Dec. 20, 2013, now Pat. No. 8,984,466, which is a continuation of application No. 13/795,573, filed on Mar. 12, 2013, now Pat. No. 8,637,950, which is a continuation of application No. 13/485,165, filed on May 31, 2012, now Pat. No. 8,418,114, which is a division of application No. 13/153,764, filed on Jun. 6, 2011, now Pat. No. 8,214,776, which is a division of application No. 12/857,065, filed on Aug. 16, 2010, now Pat. No. 7,977,233, which is a division of application No. 11/893,228, filed on Aug. 15, 2007, now Pat. No. 7,802,224, which is a division of application No. 10/999,290, filed on Nov. 29, 2004, now Pat. No. 7,271,490, which is a continuation of application No. 09/809,635, filed on Mar. 15, 2001, now Pat. No. 6,888,250.

(52) U.S. Cl.
CPC .. *H01L 21/76819* (2013.01); *H01L 21/76877* (2013.01); *H01L 23/5226* (2013.01); *G06F 17/5077* (2013.01)

(56) References Cited

U.S. PATENT DOCUMENTS

| | | |
|---|---|---|
| 5,556,805 A | 9/1996 | Tanizawa et al. |
| 5,597,668 A | 1/1997 | Nowak et al. |
| 5,621,241 A | 4/1997 | Jain |
| 5,790,417 A | 8/1998 | Chao et al. |
| 5,798,298 A | 8/1998 | Yang et al. |
| 5,822,214 A | 10/1998 | Rostoker et al. |
| 6,153,918 A | 11/2000 | Kawashima et al. |
| 6,225,697 B1 | 5/2001 | Iguchi |
| 6,253,357 B1 | 6/2001 | Takanashi |
| 6,253,362 B1 | 6/2001 | Anand et al. |
| 6,326,309 B2 | 12/2001 | Hatanaka et al. |
| 6,384,464 B1 | 5/2002 | Shin |
| 6,433,438 B2 | 8/2002 | Koubuchi et al. |
| 6,475,879 B2 | 11/2002 | Mori |
| 6,518,633 B2 | 2/2003 | Mori et al. |
| 6,528,883 B1 | 3/2003 | Dunham et al. |
| 6,560,765 B2 | 5/2003 | Mori et al. |
| 6,605,852 B2 | 8/2003 | Mori et al. |
| 7,802,224 B2 | 9/2010 | Mori et al. |
| 8,214,776 B2 | 7/2012 | Mori et al. |
| 8,637,950 B2 | 1/2014 | Mori et al. |
| 2001/0011362 A1 | 8/2001 | Yoshinaga |
| 2001/0039647 A1 | 11/2001 | Mori et al. |
| 2002/0073391 A1 | 6/2002 | Yamauchi et al. |
| 2008/0036091 A1 | 2/2008 | Koubuchi et al. |

FOREIGN PATENT DOCUMENTS

| | | |
|---|---|---|
| JP | 09-153550 A | 6/1997 |
| JP | 10-125681 A | 5/1998 |
| JP | 10-335333 A | 12/1998 |
| JP | 11-026576 A | 1/1999 |
| JP | 2000-286263 A | 10/2000 |
| JP | 2000-340568 A | 12/2000 |
| JP | 2001-168205 A | 6/2001 |

SEMICONDUCTOR DEVICE, METHOD FOR MANUFACTURING THE SAME, METHOD FOR GENERATING MASK DATA, MASK AND COMPUTER READABLE RECORDING MEDIUM

CROSS-REFERENCE TO RELATED APPLICATIONS

The present disclosure is a divisional of U.S. patent application Ser. No. 15/242,885 filed on Aug. 22, 2016, which is a continuation application of U.S. patent application Ser. No. 14/613,824 filed Feb. 4, 2015, now U.S. Pat. No. 9,455,223 issued Sep. 27, 2016, which is a continuation application of U.S. application Ser. No. 14/136,692 filed Dec. 20, 2013, now U.S. Pat. No. 8,984,466 issued Mar. 17, 2015, which is a continuation application of U.S. application Ser. No. 13/795,573 filed Mar. 12, 2013, now U.S. Pat. No. 8,637,950 issued Jan. 28, 2014, which is a continuation application of U.S. application Ser. No. 13/485,165 filed May 31, 2012, now U.S. Pat. No. 8,418,114 issued Apr. 9, 2013 which is a divisional application of U.S. application Ser. No. 13/153,764 filed on Jun. 6, 2011, now U.S. Pat. No. 8,214,776 issued Jul. 3, 2012, which is a divisional application of U.S. Ser. No. 12/857,065 filed on Aug. 16, 2010, now U.S. Pat. No. 7,977,233 issued Jul. 12, 2011 which is a divisional application of U.S. Ser. No. 11/893,228 filed on Aug. 15, 2007, now U.S. Pat. No. 7,802,224 issued Sep. 21, 2010, which is a divisional application of U.S. Ser. No. 10/999,290 filed on Nov. 29, 2004, now U.S. Pat. No. 7,271,490 issued Sep. 18, 2007, which is a continuation of U.S. Ser. No. 09/809,635 filed on Mar. 15, 2001, now U.S. Pat. No. 6,888,250 issued May 3, 2005, claiming priority to Japanese Application No. 2000-075671 filed Mar. 17, 2000, all of which are hereby incorporated by reference in their entireties.

BACKGROUND OF THE INVENTION

1. Field of the Invention

The present invention relates to a semiconductor device, a method for manufacturing the same, a method for generating mask data, a mask and a computer readable recording medium, and more particularly to a semiconductor device having multiple wiring layers, a method for manufacturing the same, a method for generating mask data, a mask, a computer readable recording medium.

2. Description of Related Art

Currently, multiple wiring layers are formed in order to realize higher circuit integration and further miniaturization of semiconductor devices. For example, multiple wiring layers are formed in the following manner. An interlayer dielectric layer is formed over a first wiring layer, and the interlayer dielectric layer is polished by a chemical-mechanical polishing method (hereinafter referred to as a "CMP method"). Then, a second wiring layer is formed over the interlayer dielectric layer, to thereby form multiple wiring layers.

As shown in FIG. 18, depending on a certain device design, first wiring layers 130a may be closely formed in one area and an isolated first wiring layer 130b may formed separated from such area on a first interlayer dielectric layer 120. Then, a second wiring layer 150 may be formed over the first wiring layers 130a and 130b through a second interlayer dielectric layer 140. In this case, the following problems occur.

When the second interlayer dielectric layer 140 is polished by a CMP method, a step difference is generated between an area of the second interlayer dielectric layer 140 where the first wiring layers 130a are closely formed and an area of the second interlayer dielectric layer 140 where the isolated first wiring layer 130b is formed. In other words, the area of the second interlayer dielectric layer 140 where the isolated first wiring layer 130b is formed is excessively polished compared to the area of the second interlayer dielectric layer 140 where the first wiring layers 130a are closely formed. This phenomenon occurs because the polishing rate differs depending on pattern densities of the wiring layers. More particularly, a polishing pressure is concentrated on the area of the second interlayer dielectric layer 140 where the isolated first wiring layer 130b is formed. As a result, the polishing rate of the second interlayer dielectric layer 140 in the area where the isolated first wiring layer 130b is formed becomes greater than the polishing rate of the second interlayer dielectric layer 140 in the area where the first wiring layers 130a are closely formed. Consequently, the area of the second interlayer dielectric layer 140 in the area where the isolated first wiring layer 130b is formed is excessively polished.

When the second interlayer dielectric layer 140 in the area where the isolated first wiring layer 130b is formed is excessively polished, problems occur. For example, the thickness of the second interlayer dielectric layer 140 becomes irregular. When the thickness of the second interlayer dielectric layer 140 becomes irregular, a step difference is generated in the second wiring layer 150 that is formed over the interlayer dielectric layer 140. When the step difference is generated in the second wiring layer 150, problems occur. For example, when the second wiring layer 150 is patterned by a photolithography, a designed pattern is not optically focused depending on areas, and the pattern may not be formed in such areas, or designed dimensions of the pattern may not be obtained even if the pattern is formed.

In order to solve the problems described above, one technique is proposed. According to the technique, dummy wiring layers 132 are formed in an area between the area where the first wiring layers 130a are densely formed and the area where the isolated first wiring layer 130b is formed, as shown in FIG. 19.

The technique for forming such dummy wiring layers is described in Japanese laid-open patent application HEI 4-218918, Japanese laid-open patent application HEI 10-335333, U.S. Pat. No. 4,916,514, U.S. Pat. No. 5,556,805, U.S. Pat. No. 5,597,668, U.S. Pat. No. 5,790,417 and U.S. Pat. No. 5,798,298.

SUMMARY OF THE INVENTION

It is an object of the present invention to provide a semiconductor device in which dummy wiring layers are formed in a specified pattern, a method for manufacturing the same, a method for generating mask data, a mask, and a computer readable recording medium.

(A) In accordance with a first embodiment of the present invention, a semiconductor device comprises: a first wiring layer defining a row direction and first virtual linear lines extending in a direction that traverses the row direction; and a plurality of dummy wiring layers provided in the same level as the first wiring layer, wherein the row direction and the first virtual linear lines define an angle of 2 to 40 degrees, and the plurality of dummy wiring layers are disposed on the first virtual linear lines.

The "row direction" used here refers to one direction that is virtually defined in consideration of, for example, a restriction region.

In the semiconductor device in accordance with the first embodiment of the present invention, the dummy wiring layers are disposed on the first virtual linear lines. The row direction and the first virtual linear lines define an angle between 2 degrees and 40 degrees. In other words, adjacent ones of the dummy wiring layers that are formed on the first virtual linear lines and disposed in the row direction are mutually offset in a column direction. As a result, the dummy wiring layers can be densely formed in an area adjacent to a restriction region that extends in the row direction. In other words, even when some of the dummy wiring layers overlap the restriction region, the other dummy wiring layers are securely disposed in an area adjacent to the restriction region. As a consequence, when a dielectric layer formed over the first wiring layer is polished, the polishing pressure can be securely distributed over the dummy wiring layers even in an area adjacent to the restriction region.

Moreover, since the dummy wiring layers can be securely provided in a region adjacent to the restriction region, the dummy wiring layers can be securely disposed in an area where a separation between adjacent ones of the first wiring layers is narrow.

In the semiconductor device in accordance with the first embodiment of the present invention, the first virtual linear lines may preferably be spaced a specified gap from one another. The gap may preferably be 1-16 µm.

A center of each of the dummy wiring layers may preferably be located on each of the first virtual linear lines.

(B) In accordance with a second embodiment of the present invention, a semiconductor device comprises: a first wiring layer defining a column direction and second virtual linear lines extending in a direction that traverses the column direction; and a plurality of dummy wiring layers provided in the same level as the first wiring layer, wherein the column direction and the second virtual linear lines define an angle of 2 to 40 degrees, and the plurality of dummy wiring layers are disposed on the second virtual linear lines.

The "column direction" used here refers to one direction that perpendicularly traverses the row direction and is virtually defined in consideration of, for example, a restriction region.

In the semiconductor device in accordance with the second embodiment of the present invention, the dummy wiring layers are disposed on the second virtual linear lines. The column direction and the second virtual linear lines define an angle between 2 degrees and 40 degrees. In other words, adjacent ones of the dummy wiring layers that are formed on the second virtual linear lines and disposed in the column direction are mutually offset in the row direction. As a result, the dummy wiring layers in high density can be readily formed in an area adjacent to a restriction region that extends in the column direction. In other words, even when some of the dummy wiring layers overlap the restriction region, the other dummy wiring layers are securely disposed in an area adjacent to the restriction region. As a consequence, when a dielectric layer formed over the first wiring layer is polished, the polishing pressure can be securely distributed over the dummy wiring layers even in an area adjacent to the restriction region.

Moreover, since the dummy wiring layers can be securely provided in a region adjacent to the restriction region, the dummy wiring layers can be securely disposed in a narrow area between two adjacent ones of the first wiring layers.

Also, the semiconductor device in accordance with the first embodiment and the semiconductor device in accordance with the second embodiment may be combined. By the semiconductor device in accordance with the combined embodiments, the dummy wiring layers can be more securely formed in areas adjacent to restriction regions.

In the semiconductor device in accordance with the second embodiment of the present invention, the second virtual linear lines may preferably be spaced a specified gap from one another. The gap may preferably be 1-16 µm.

A center of each of the dummy wiring layers may preferably be located on each of the second virtual linear lines.

In the semiconductor device in accordance with the first embodiment or the second embodiment, the dummy wiring layers may be formed in any one of the following manners:

(1) A plan area of the dummy wiring layers is 30-50% of a unit plan area. As a result, the polishing pressure can be more effectively distributed on the dummy wiring layers. In a preferred embodiment, the plan area of the dummy wiring layers may be about 40% of the unit plan area.

(2) Each of the dummy wiring layers may have a generally rectangular shape in plan view. In other words, when the silicon substrate is viewed from above, each of the dummy wiring layers may have a generally rectangular shape. The formation of a dummy wiring layer in a generally rectangular shape is relatively easy. Preferably, each of the dummy wiring layers may have a generally square shape. By forming the dummy wiring layers in a generally square shape, the dummy wiring layers can be more densely formed. For example, the dummy wiring layers can be more securely formed in an area adjacent to a cross section where restriction regions cross one another. As a result, the dummy wiring layers can be more effectively formed in an area adjacent to a restriction region with a complex pattern (for example, a prohibited area around a first wiring layer that is formed with a complex pattern).

(3) When each of the dummy wiring layers has a rectangular shape in plan view (i.e., as viewed from above), adjacent ones of the dummy wiring layers disposed on the first virtual linear line or adjacent ones of the dummy wiring layers disposed on the second virtual linear line have sides that partially oppose to one another as viewed from above. In a preferred embodiment, the sides of the adjacent ones of the dummy wiring layers are spaced a distance from one another, wherein the distance may preferably be shorter than each of the sides of each of the dummy wiring layers. Preferably, the distance between the opposing sides may be 0.5-5 µm. More preferably, the distance between the opposing sides may be about 1 µm.

(4) When the plan configuration of each of the dummy wiring layers is rectangular, each side of each of the dummy wiring layers may preferably have a length of about 1 µm or greater. When each side of each of the dummy wiring layers is about 1 µm long or greater, the amount of data for generating masks which is used to form the dummy wiring layers is prevented from increasing.

In a preferred embodiment, each side of each of the dummy wiring layers is about 10 µm long or shorter. It is noted that a step difference is more likely generated when a separation between adjacent wiring layers is greater than 10 µm. Therefore, when each side of each of the dummy wiring layers is 10 µm long or shorter, the dummy wiring layers can be formed in a space where the adjacent wiring layers are separated from one another by a distance greater than 10 µm. Accordingly, step differences in an interlayer dielectric layer can be more effectively eliminated. In a preferred embodiment, the each side of each of the dummy wiring layers has a length of about 2 µm.

(C) In accordance with a third embodiment of the present invention, a semiconductor device comprises: a first wiring layer defining a row direction and a column direction; and a plurality of dummy wiring layers provided in the same level as the first wiring layer, wherein each of the dummy wiring layers has a generally square shape in plan, adjacent ones of the dummy wiring layers that are disposed in the row direction are spaced a first distance from one another, the first distance being about a half of a side of each of the dummy wiring layers, and the adjacent ones of the dummy wiring layers that are disposed in the row direction are offset by a second distance from one another in the column direction, the second distance being about a half of a side of each of the dummy wiring layers.

The "row direction" and the "column direction" may be defined in a similar manner as the first and second embodiments.

In accordance with the third embodiment of the present invention, the adjacent dummy wiring layers disposed in the row direction are mutually offset in the column direction. As a result, the semiconductor device in accordance with the third embodiment of the present invention provides the same effects achieved by the semiconductor device in accordance with the first embodiment of the present invention.

(D) In accordance with a fourth embodiment of the present invention, a semiconductor device comprises: a first wiring layer defining a row direction and a column direction; and a plurality of dummy wiring layers provided in the same level as the first wiring layer, wherein each of the dummy wiring layers has a generally square shape in plan, adjacent ones of the dummy wiring layers that are disposed in the column direction are spaced a first distance from one another, the first distance being about a half of a side of each of the dummy wiring layers, and the adjacent ones of the dummy wiring layers that are disposed in the column direction are offset by a second distance from one another in the row direction, the second distance being about a half of a side of each of the dummy wiring layers.

The "row direction" and the "column direction" may be defined in a similar manner as the first and second embodiments.

In accordance with the fourth embodiment of the present invention, the adjacent dummy wiring layers disposed in the column direction are mutually offset in the row direction. As a result, the semiconductor device in accordance with the fourth embodiment of the present invention provides the same effects achieved by the semiconductor device in accordance with the second embodiment of the present invention.

Also, the semiconductor device in accordance with the third embodiment and the semiconductor device in accordance with the fourth embodiment may be combined. By the semiconductor device in accordance with the combined embodiments, the dummy wiring layers can be more securely formed in areas adjacent to restriction regions.

In the semiconductor device in accordance with the third embodiment or the fourth embodiment, each side of each of the dummy wiring layers may preferably have a length of about 2 µm.

The semiconductor device in accordance with any one of the first embodiment through the fourth embodiment may preferably have at least one restriction region, wherein the dummy wiring layers that would at least partially overlap the at least one restriction region are not formed at all. As a result, pattern skipping in the pattern for the dummy wiring layers is securely prevented. In one embodiment, the restriction region may include a wiring effective region and a prohibited area provided around the wiring effective region.

The wiring effective region may include, for example, a region where the first wiring layer is formed. Also, the semiconductor device may include a second wiring layer formed at a level above the first wiring layer and a third wiring layer formed at a level below the first wiring layer. In this case, the wiring effective region may preferably include a region where a contact hole is formed that connects the second wiring layer and the third wiring layer. For example, the third wiring layer may be a diffusion layer formed in a semiconductor substrate, a wiring layer formed over a surface of a semiconductor substrate, or a wiring layer formed over an interlayer dielectric layer.

The width of the prohibited area is determined in consideration of circuit design. For example, the prohibited area has a width of 0.5-100 µm. When a semiconductor device does not use circuits that use electromagnetic effects, for example, inductors using wiring layers, the prohibited area may preferably have a width of 0.5-20 µm. It is noted that the width of the prohibited area may or may not be the same along the entire prohibited area.

(E) In accordance with a fifth embodiment of the present invention, a method is provided for manufacturing a semiconductor device. The method comprises forming a first wiring layer defining a row direction and first virtual linear lines extending in a direction that traverses the row direction, and forming a plurality of dummy wiring layers, wherein the row direction and the first virtual linear lines define an angle of 2-40 degrees, and the plurality of dummy wiring layers are disposed on the first virtual linear lines.

In accordance with the fifth embodiment of the present invention, the dummy wiring layers are formed in the step of forming the first wiring layer. The dummy wiring layers are formed in the same pattern as the pattern described above in conjunction with the semiconductor device of the first embodiment of the present invention. As a result, the dummy wiring layers can be securely formed in an area adjacent to a restriction region. As a consequence, when a dielectric layer formed over the first wiring layer is polished, the polishing pressure can be securely distributed over the dummy wiring layers. Accordingly, the interlayer dielectric layer obtained after the polishing step can have a uniform thickness.

(F) A method for manufacturing a semiconductor device in accordance with a sixth embodiment of the present invention comprises forming a first wiring layer defining a column direction and second virtual linear lines extending in a direction that traverses the column direction, and forming a plurality of dummy wiring layers, wherein the column direction and the second virtual linear lines define an angle of 2-40 degrees, and the plurality of dummy wiring layers are disposed on the second virtual linear lines.

In accordance with the sixth embodiment of the present invention, the dummy wiring layers are formed in the same pattern as the pattern described above in conjunction with the semiconductor device of the second embodiment of the present invention. As a result, the sixth embodiment of the present invention can provide the same effects that are achieved by the method for manufacturing a semiconductor device in accordance with the fifth embodiment of the present invention.

Also, the method for manufacturing a semiconductor device in accordance with the fifth embodiment and the method for manufacturing a semiconductor device in accordance with the sixth embodiment may be combined.

By the method for manufacturing a semiconductor device in accordance with the combined embodiments, dummy wiring layers can be more securely formed in areas adjacent to restriction regions. Accordingly, the interlayer dielectric layer obtained after the polishing step can have a more uniform thickness.

The features of the first and second virtual linear lines described above in connection with the semiconductor devices are applicable to the fifth and sixth embodiments of the present invention. Also, the dummy wiring layers can be formed in manners similar to the first through fourth embodiments described above in connection with the semiconductor devices.

(G) A method for manufacturing a semiconductor device in accordance with a seventh embodiment of the present invention comprises forming a first wiring layer defining a row direction and a column direction and a plurality of dummy wiring layers, wherein each of the dummy wiring layers has a generally square shape in plan view, adjacent ones of the dummy wiring layers that are disposed in the row direction are spaced a first distance from one another, the first distance being about a half of a side of each of the dummy wiring layers, and the adjacent ones of the dummy wiring layers that are disposed in the row direction are offset by a second distance from one another in the column direction, the second distance being about a half of a side of each of the dummy wiring layers.

In accordance with the seventh embodiment of the present invention, the dummy wiring layers are formed in the same pattern as the pattern described above in conjunction with the semiconductor device of the third embodiment of the present invention. As a result, the seventh embodiment of the present invention can provide the same effects that are achieved by the method for manufacturing a semiconductor device in accordance with the fifth embodiment of the present invention.

(H) A method for manufacturing a semiconductor device in accordance with an eighth embodiment of the present invention comprises forming a first wiring layer defining a row direction and a column direction and a plurality of dummy wiring layers, wherein each of the dummy wiring layers has a generally square shape in plan view, adjacent ones of the dummy wiring layers that are disposed in the column direction are spaced a first distance from one another, the first distance being about a half of a side of each of the dummy wiring layers, and the adjacent ones of the dummy wiring layers that are disposed in the column direction are offset by a second distance from one another in the row direction, the second distance being about a half of a side of each of the dummy wiring layers.

In accordance with the eighth embodiment of the present invention, the dummy wiring layers are formed in the same pattern as the pattern described above in conjunction with the semiconductor device of the fourth embodiment of the present invention. As a result, the eighth embodiment of the present invention can provide the same effects that are achieved by the method for manufacturing a semiconductor device in accordance with the fifth embodiment of the present invention.

Also, the method for manufacturing a semiconductor device in accordance with the seventh embodiment and the method for manufacturing a semiconductor device in accordance with the eighth embodiment may be combined.

By the method for manufacturing a semiconductor device in accordance with the combined embodiments, the dummy wiring layers can be more securely formed in areas adjacent to restriction regions. Accordingly, the interlayer dielectric layer obtained after the polishing step can have a more uniform thickness.

In one embodiment, the restriction region may have the same features as described above in connection with the semiconductor devices.

(I) In accordance with a ninth embodiment of the present invention, a method is provided for generating mask data that is used for manufacturing a semiconductor device. The method comprises the steps of:

(a) setting a restriction region pattern that defines the restriction region;

(b) setting dummy patterns that define the dummy wiring layers; and (c) mixing the restriction region pattern and the dummy patterns, wherein the dummy patterns that at least partially overlap the restriction region pattern are entirely excluded.

In accordance with the ninth embodiment of the present invention, for example, the following two effects are achieved.

(1) The dummy patterns define dummy wiring layers. Accordingly, the dummy patterns include patterns corresponding to placement patterns of the dummy wiring layers. As a result, in step (c), the dummy patterns in high density can be readily set in an area adjacent to a restriction region pattern. In other words, even when some of the dummy patterns overlap the restriction region pattern, the other dummy patterns are securely generated in an area adjacent to the restriction region pattern. As a consequence, dummy patterns can be securely set in regions adjacent to restriction region patterns. As a result, the following effects are achieved.

When dummy wiring layers are formed, the dummy wiring layers can be securely disposed in an area adjacent to the restriction regions. As a consequence, when a dielectric layer formed over the wiring layer is polished, the polishing pressure is securely distributed on the dummy wiring layers in areas adjacent to the restriction regions. As a result, an interlayer dielectric layer formed in areas adjacent to the restriction regions and in other areas over the wiring layers can have a uniform thickness.

Moreover, since the dummy patterns can be securely provided in areas adjacent to the restriction regions, the dummy patterns can be securely disposed in an area where a separation between adjacent restriction region patterns is narrow.

(2) Also, in accordance with the present invention, the dummy patterns that at least partially overlap the restriction region pattern are entirely excluded. As a result, pattern skipping of patterns of the dummy wiring layers can be securely prevented, as described below in detail.

(J) In accordance with a tenth embodiment of the present invention, a method is provided for generating mask data that is used for a method for manufacturing a semiconductor device. The semiconductor device comprises a first wiring layer and a plurality of dummy wiring layers provided in the same level as the first wiring layer. Placement of the plurality of dummy wiring layers is determined by a method including the steps of:

(a) setting a restriction region pattern that defines a restriction region;

(b) setting dummy patterns that define the dummy wiring layers, and defining a row direction and first virtual linear lines extending in a direction that traverses the row direction, wherein the row direction and the first virtual linear lines define an angle of 2-40 degrees, and the dummy wiring layers are disposed on the first virtual linear lines; and (c) mixing the restriction region pattern and the dummy patterns, wherein the dummy patterns that at least partially overlap the restriction region pattern are entirely excluded.

The "row direction" used here refers to one direction that is virtually defined in consideration of, for example, a restriction region.

In accordance with the tenth embodiment of the present invention, the dummy patterns are formed in a manner to be disposed on the first virtual linear lines. The row direction and the first virtual linear lines define an angle of 2 to 40 degrees. In other words, adjacent ones of the dummy patterns that are formed on the first virtual linear lines and disposed next to each other in the row direction are mutually offset in a column direction. As a result, the dummy patterns with high density can be readily disposed in areas adjacent to restriction region patterns that extend in the row direction. In other words, even when some of the dummy patterns overlap the restriction region patterns, the other dummy patterns are securely disposed in the areas adjacent to the restriction region patterns. As a consequence, the tenth embodiment can provide the effect (1) achieved by the method for generating mask data of the ninth embodiment.

Also, the tenth embodiment can provide the effect (2) achieved by the method for generating mask data of the ninth embodiment.

(K) In accordance with an eleventh embodiment of the present invention, a method is provided for generating mask data that is used for a method for manufacturing a semiconductor device. The semiconductor device comprises a first wiring layer and a plurality of dummy wiring layers provided in the same level as the first wiring layer. Placement of the plurality of dummy wiring layers is determined by a method including the steps of:

(a) setting a restriction region pattern that defines a restriction region;

(b) setting dummy patterns that define the dummy wiring layers, and defining a column direction and second virtual linear lines extending in a direction that traverses the column direction, wherein the column direction and the second virtual linear lines define an angle of 2-40 degrees, and the dummy wiring layers are disposed on the second virtual linear lines; and (c) mixing the restriction region pattern and the dummy patterns, wherein the dummy patterns that at least partially overlap the restriction region pattern are entirely excluded.

The "column direction" used here refers to one direction that perpendicularly traverses the row direction and is virtually defined in consideration of, for example, a restriction region.

In accordance with the eleventh embodiment of the present invention, the dummy patterns are formed in a manner to be disposed on the second virtual linear lines. The column direction and the second virtual linear lines define an angle of 2 to 40 degrees. In other words, adjacent ones of the dummy patterns that are formed on the second virtual linear lines and disposed next to each other in the column direction are mutually offset in the row direction. As a result, the dummy patterns with high density can be readily disposed in areas adjacent to restriction region patterns that extend in the column direction. In other words, even when some of the dummy patterns overlap the restriction region patterns, the other dummy patterns are securely disposed in areas adjacent to the restriction region patterns. As a consequence, the eleventh embodiment can provide the effect (1) achieved by the method for generating mask data of the ninth embodiment.

Also, the eleventh embodiment can provide the effect (2) achieved by the method for generating mask data of the ninth embodiment.

Also, the method for generating mask data in accordance with the tenth embodiment and the method for generating mask data in accordance with the eleventh embodiment may be combined. By the method for generating mask data in accordance with the combined embodiments, dummy patterns can be more securely formed in areas adjacent to restriction regions.

(L) In accordance with a twelfth embodiment of the present invention, a method is provided for generating mask data that is used for a method for manufacturing a semiconductor device. The semiconductor device comprises a first wiring layer defining a row direction and a column direction and a plurality of dummy wiring layers provided in an identical level as the first wiring layer, wherein placement of the plurality of dummy wiring layers is determined by a method including the steps of:

(a) setting a restriction region pattern that defines a restriction region;

(b) setting dummy patterns that define the dummy wiring layers, wherein each of the dummy wiring layers has a generally square shape in plan view, adjacent ones of the dummy wiring layers that are disposed in the row direction are spaced a first distance from one another, the first distance being about a half of a side of each of the dummy wiring layers, and the adjacent ones of the dummy wiring layers that are disposed in the row direction are offset by a second distance from one another in the column direction, the second distance being about a half of a side of each of the dummy wiring layers; and (c) mixing the restriction region pattern and the dummy patterns, wherein the dummy patterns that at least partially overlap the restriction region pattern are entirely excluded.

The "row direction" and the "column direction" may be defined in a similar manner as the tenth and eleventh embodiments.

In the method for generating mask data in accordance with the twelfth embodiment of the present invention, the adjacent dummy patterns disposed next to one another in the row direction are mutually offset in the column direction. As a result, the method for generating mask data in accordance with the twelfth embodiment of the present invention provides the same effects achieved by the method for generating mask data in accordance with the tenth embodiment of the present invention.

(M) In accordance with a thirteenth embodiment of the present invention, a method is provided for generating mask data that is used for a method for manufacturing a semiconductor device. The semiconductor device comprises a first wiring layer defining a row direction and a column direction and a plurality of dummy wiring layers provided in the same level as the first wiring layer, wherein placement of the plurality of dummy wiring layers is determined by a method including the steps of:

(a) setting a restriction region pattern that defines a restriction region;

(b) setting dummy patterns that define the dummy wiring layers, wherein each of the dummy wiring layers has a generally square shape in plan, adjacent ones of the dummy wiring layers that are disposed in the column direction are spaced a first distance from one another, the first distance being about a half of a side of each of the dummy wiring layers, and the adjacent ones of the dummy wiring layers that are disposed in the column direction are offset by a second distance from one another in the row direction, the second distance being about a half of a side of each of the dummy wiring layers; and (c) mixing the restriction region pattern and the dummy patterns, wherein the dummy patterns that at least partially overlap the restriction region pattern are entirely excluded.

The "row direction" and the "column direction" may be defined in a similar manner as the tenth and eleventh embodiments.

In the method for generating mask data in accordance with the thirteenth embodiment of the present invention, the adjacent dummy patterns disposed next to one another in the column direction are mutually offset in the row direction. As a result, the method for generating mask data in accordance with the thirteenth embodiment of the present invention provides the same effects achieved by the method for generating mask data in accordance with the eleventh embodiment of the present invention.

Also, the method for generating mask data in accordance with the twelfth embodiment and the method for generating mask data in accordance with the thirteenth embodiment may be combined. By the method for generating mask data in accordance with the combined embodiments, dummy patterns can be more securely formed in areas adjacent to restriction regions.

The method for generating mask data in accordance with any one of the tenth embodiment through the thirteenth embodiment may have any one of the following embodiments:

The restriction region includes a wiring effective region and a prohibited area provided around the wiring effective region, and the step (a) includes the steps of: (a-1) setting a wiring effective region pattern that defines the wiring effective region and (a-2) setting a prohibited area pattern that defines the prohibited area about the wiring effective region pattern.

The wiring effective region pattern may include a wiring pattern.

When the semiconductor device includes a second wiring layer formed at a level above the first wiring layer and a third wiring layer formed at a level below the first wiring layer, and a contact hole for connecting the second wiring layer and the third wiring layer is formed, the wiring effective region pattern may preferably include a contact hole pattern for connecting the second wiring layer and the third wiring layer.

(N) In accordance with a fourteenth embodiment of the present invention, a method is provided for generating mask data that is used for a method for manufacturing a semiconductor device. The semiconductor device comprises a first wiring layer defining a row direction and first virtual linear lines extending in a direction that traverses the row direction and a plurality of dummy wiring layers provided in the same level as the first wiring layer, wherein the row direction and the first virtual linear lines define an angle of 2-40 degrees, and the plurality of dummy wiring layers are disposed to be located on the first virtual linear lines. The method comprises the steps of:

(a) setting a restriction region pattern that defines a restriction region;

(b) setting dummy patterns that define the dummy wiring layers; and (c) mixing the restriction region pattern and the dummy patterns, wherein the dummy patterns that at least partially overlap the restriction region pattern are entirely excluded.

The "row direction" may be defined in a similar manner as the tenth embodiment.

In accordance with the fourteenth embodiment of the present invention, for example, the following two effects are achieved.

(1) In accordance with the fourteenth embodiment of the present invention, the dummy patterns are set such that the dummy wiring layers are disposed on the first virtual linear lines. The row direction and the first virtual linear lines define an angle of 2 to 40 degrees. In other words, the dummy patterns are set such that adjacent ones of the dummy wiring layers formed on the first virtual linear lines and disposed next to one another in the row direction are mutually offset in a column direction. Accordingly, the adjacent dummy patterns disposed next to one another in the row direction are mutually offset in the column direction. As a result, in step (c), the dummy patterns can be readily set with high density in an area adjacent to a restriction region pattern that extends in the row direction. In other words, even when some of the dummy patterns overlap the restriction region pattern, the other dummy patterns are securely generated in an area adjacent to the restriction region pattern. As a consequence, dummy patterns can be securely provided in a region where a gap between adjacent restriction region patterns is narrow. As a result, the following effects are achieved.

When dummy wiring layers are formed, the dummy wiring layers can be securely disposed in an area adjacent to the restriction regions. As a consequence, when a dielectric layer formed over the first wiring layer is polished, the polishing pressure is securely distributed on the dummy wiring layers in areas adjacent to the restriction regions.

(2) Also, in accordance with the fourteenth embodiment of the present invention, the dummy patterns that at least partially overlap the restriction region pattern are entirely excluded. As a result, the generation of pattern skipping of patterns of dummy wiring layers can be securely prevented, as described below in detail.

(O) In accordance with a fifteenth embodiment of the present invention, a method is provided for generating mask data that is used for a method for manufacturing a semiconductor device. The semiconductor device comprises a first wiring layer defining a column direction and second virtual linear lines extending in a direction that traverses the column direction and a plurality of dummy wiring layers provided in the same level as the second wiring layer, wherein the column direction and the second virtual linear lines define an angle of 2-40 degrees, and the plurality of dummy wiring layers are located on the second virtual linear lines. The method comprises the steps of:

(a) setting a restriction region pattern that defines a restriction region;

(b) setting dummy patterns that define the dummy wiring layers; and (c) mixing the restriction region pattern and the dummy patterns, wherein the dummy patterns that at least partially overlap the restriction region pattern are entirely excluded.

The "column direction" may be defined in a similar manner as the eleventh embodiment.

In accordance with the fifteenth embodiment of the present invention, for example, the following two effects are achieved.

(1) In accordance with the fifteenth embodiment of the present invention, the dummy patterns are set such that the dummy wiring layers are disposed to be located on the second virtual linear lines. The column direction and the second virtual linear lines define an angle of 2 to 40 degrees. In other words, the dummy patterns are set such that adjacent ones of the dummy wiring layers formed on the second virtual linear lines and disposed next to one another in the column direction are mutually offset in the row direction. Accordingly, the adjacent dummy patterns disposed next to one another in the column direction are mutually offset in the row direction. As a result, in step (c), the dummy patterns can be readily set with high density in an area adjacent to a restriction region pattern that extends in the column direction. In other words, even when some of the dummy patterns overlap the restriction region pattern, the other dummy patterns are securely generated in an area adjacent to the restriction region pattern. As a consequence, dummy patterns can be securely provided in a region where a separation between adjacent restriction region patterns is narrow. As a result, the effect (1) described above in conjunction with the method for generating mask data of the fourteenth embodiment can be achieved.

(2) In accordance with the fifteenth embodiment of the present invention, the dummy patterns that at least partially overlap the restriction region pattern are entirely excluded. As a result, the effect (2) described above in conjunction with the method for generating mask data of the fourteenth embodiment can be achieved.

Also, the method for generating mask data in accordance with the fourteenth embodiment and the method for generating mask data in accordance with the fifteenth embodiment may be combined. By the method for generating mask data in accordance with the combined embodiments, dummy wiring layers can be more securely formed in areas adjacent to restriction regions.

(P) In accordance with a sixteenth embodiment of the present invention, a method is provided for generating mask data that is used for a method for manufacturing a semiconductor device. The semiconductor device comprises a first wiring layer defining a row direction and a column direction and a plurality of dummy wiring layers provided in the same level as the first wiring layer, wherein each of the dummy wiring layers has a generally square shape in plan view, adjacent ones of the dummy wiring layers that are disposed next to one another in the row direction are spaced a first distance from one another, the first distance being about a half of a side of each of the dummy wiring layers, and the adjacent ones of the dummy wiring layers that are disposed next to one another in the row direction are offset by a second distance from one another in the column direction, the second distance being about a half of a side of each of the dummy wiring layers, and the method comprises the steps of:

(a) setting a restriction region pattern that defines a restriction region;

(b) setting dummy patterns that define the dummy wiring layers; and (c) mixing the restriction region pattern and the dummy patterns, wherein the dummy patterns that at least partially overlap the restriction region pattern are entirely excluded.

The "row direction" and the "column direction" may be defined in a similar manner as the tenth and eleventh embodiments.

In the method for generating mask data in accordance with the sixteenth embodiment of the present invention, the adjacent dummy patterns disposed next to one another in the row direction are mutually offset in the column direction. As a result, the method for generating mask data in accordance with the sixteenth embodiment of the present invention provides the same effects achieved by the method for generating mask data in accordance with the fourteenth embodiment of the present invention.

(Q) In accordance with a seventeenth embodiment of the present invention, a method is provided for generating mask data that is used for a method for manufacturing a semiconductor device. The semiconductor device comprises a first wiring layer defining a row direction and a column direction and a plurality of dummy wiring layers provided in the same level as the first wiring layer, wherein each of the dummy wiring layers has a generally square shape in plan view, adjacent ones of the dummy wiring layers that are disposed next to one another in the column direction are spaced a first distance from one another, the first distance being about a half of a side of each of the dummy wiring layers, and the adjacent ones of the dummy wiring layers that are disposed in the column direction are offset by a second distance from one another in the row direction, the second distance being about a half of a side of each of the dummy wiring layers, and the method comprises the steps of:

(a) setting a restriction region pattern that defines a restriction region;

(b) setting dummy patterns that define the dummy wiring layers; and (c) mixing the restriction region pattern and the dummy patterns, wherein the dummy patterns that at least partially overlap the restriction region pattern are entirely excluded.

The "row direction" and the "column direction" may be defined in a similar manner as the tenth and eleventh embodiments.

In the method for generating mask data in accordance with the seventeenth embodiment of the present invention, the adjacent dummy patterns disposed next to one another in the column direction are mutually offset in the row direction. As a result, the method for generating mask data in accordance with the seventeenth embodiment of the present invention provides the same effects achieved by the method for generating mask data in accordance with the fifteenth embodiment of the present invention.

Also, the method for generating mask data in accordance with the sixteenth embodiment and the method for generating mask data in accordance with the seventeenth embodiment may be combined. By the method for generating mask data in accordance with the combined embodiments, the dummy wiring layers can be more securely formed in areas adjacent to restriction regions.

The restriction region may have the same features as described above in connection with the semiconductor devices. Also, the wiring effective region may have the same features as described above in connection with the semiconductor devices.

The method for generating mask data in accordance with any one of the ninth through seventeenth embodiments may further include, before step (c), step (d) of reversing the restriction region pattern. By the inclusion of step (d), the restriction region pattern and the dummy patterns can be easily mixed.

A mask in accordance with one embodiment of the present invention can be formed by the method for generating mask data described above.

By the use of the mask in accordance with the present invention in a method for manufacturing a semiconductor device, dummy wiring layers can be securely formed in areas adjacent to restriction regions.

A computer readable recording medium in accordance with the present invention stores mask data obtained by the method for generating mask data according to any one of the embodiments described above.

A mask of the present invention can be formed based on the data stored in the computer readable recording medium in accordance with the present invention.

Other features and advantages of the invention will be apparent from the following detailed description, taken in conjunction with the accompanying drawings that illustrate, by way of example, various features of embodiments of the invention.

DESCRIPTION OF PREFERRED EMBODIMENTS

Preferred embodiments of the present invention will be described below with reference to the accompanying drawings.

Figure 1:
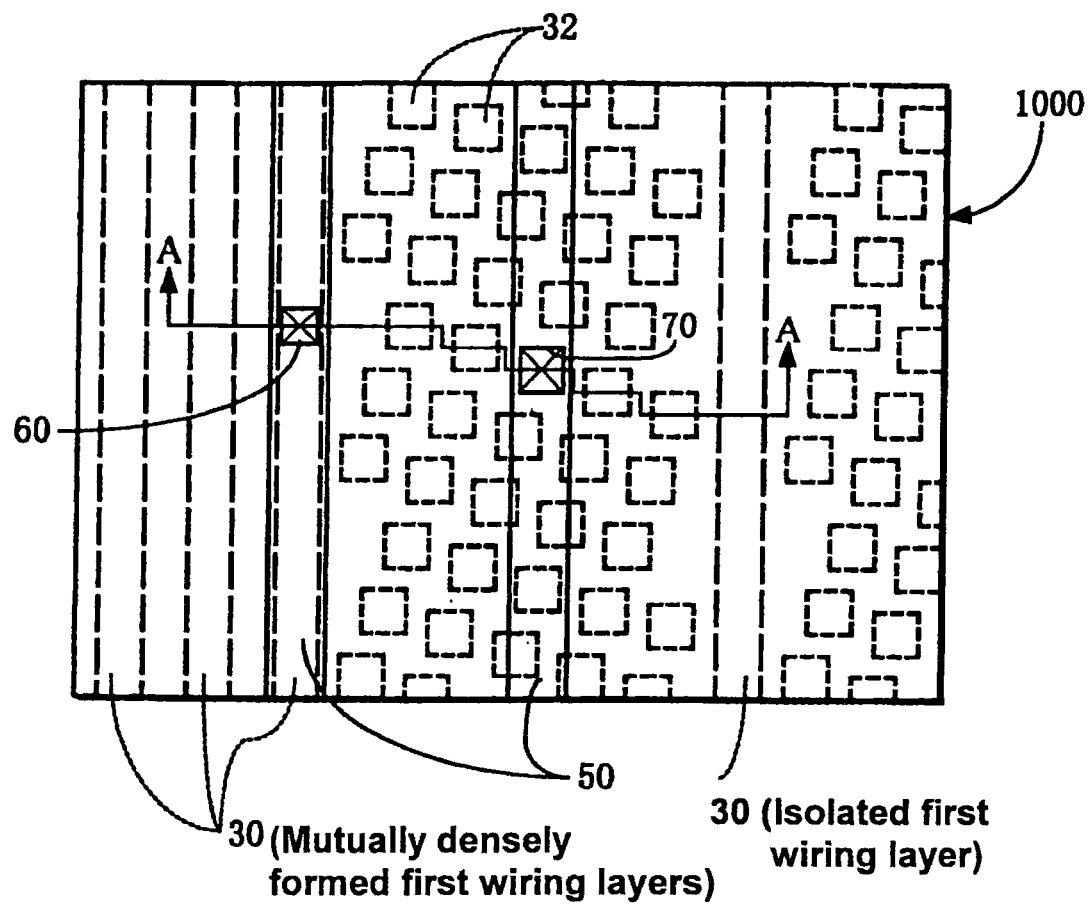
FIG. 1 schematically shows a plan view of a semiconductor device.
Figure 2:
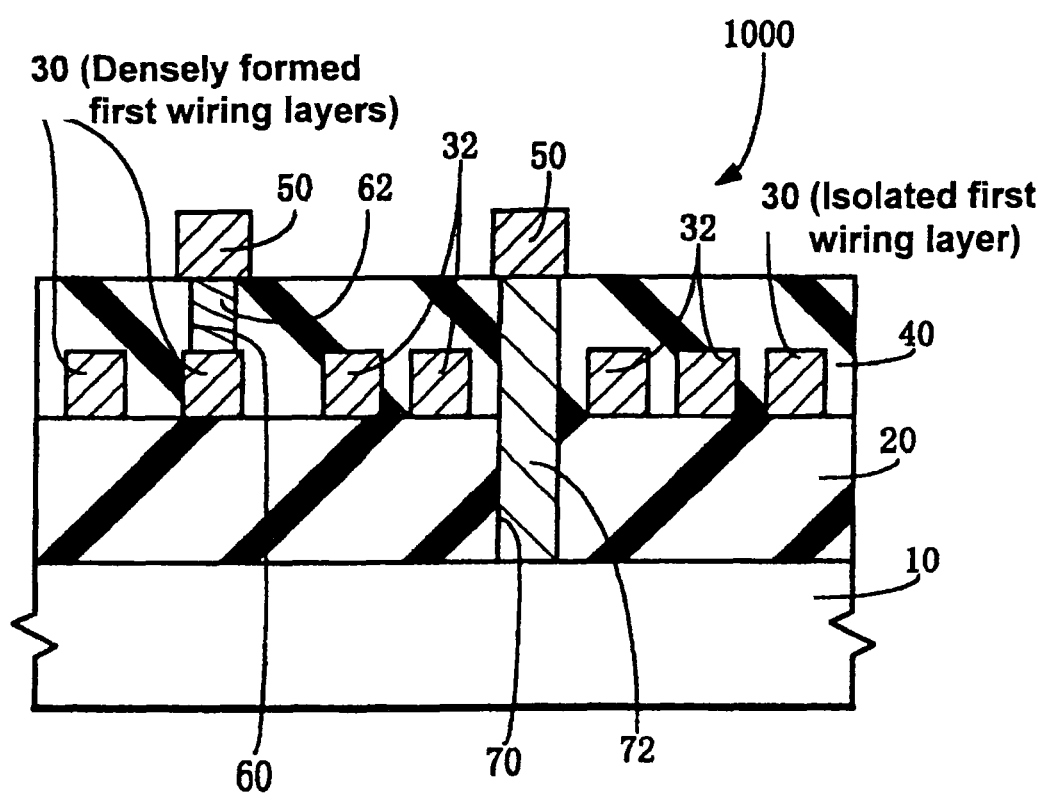
FIG. 2 schematically shows a cross-sectional view taken along a line A-A of FIG. 1.

Semiconductor devices in accordance with embodiments of the present invention will be described below. FIG. 1 illustratively shows a plan view of a semiconductor device. FIG. 2 illustratively shows a cross-sectional view taken along a line A-A of FIG. 1.

Referring to FIG. 2, a semiconductor device 1000 has a semiconductor substrate (for example, a silicon substrate) 10. Semiconductor elements such as MOSFETs, wiring layers and element isolation regions (not shown) are formed on a surface of the semiconductor substrate 10. A first interlayer dielectric layer 20 is formed over the semiconductor substrate 10

First wiring layers 30 and dummy wiring layers 32 are formed over the first interlayer dielectric layer 20. Depending on certain device designs, some of the first wiring layers 30 may be closely formed in one area and an isolated one of the first wiring layer 30 may be formed separated from the other first wiring layers 30

Contact holes (not shown) may be formed in the first interlayer dielectric layer 20 at specified locations to connect semiconductor elements or wiring layers formed on the surface of the semiconductor substrate 10 to the first wiring layers 30. Contact layers (not shown) may be formed in the contact holes. The contact layers may be formed from, for example, tungsten plugs, aluminum alloy layers or copper layers.

A second interlayer dielectric layer 40 is formed over the first wiring layers 30 and the dummy wiring layers 32. Second wiring layers 50 are formed over the second interlayer dielectric layer 40.

A first contact hole 60 is formed in the second interlayer dielectric layer 40. The first contact hole 60 is a connection aperture for connecting the first wiring layers 30 and the second wiring layers 50. A first contact layer 62 is formed in the first contact hole 60. The first contact hole 62 is formed from, for example, a tungsten plug, an aluminum alloy layer or a copper layer.

A second contact hole 70 is formed through the first interlayer dielectric layer 20 and the second interlayer dielectric layer 40. The second contact hold 70 is a connection aperture for connecting a semiconductor element or a wiring layer formed on the surface of the semiconductor substrate 10 to the second wiring layer 50. A second contact layer 72 is formed in the second contact hole 70. The second contact layer 72 is formed from, for example, a tungsten plug, an aluminum alloy layer or a copper layer.

Figure 3:
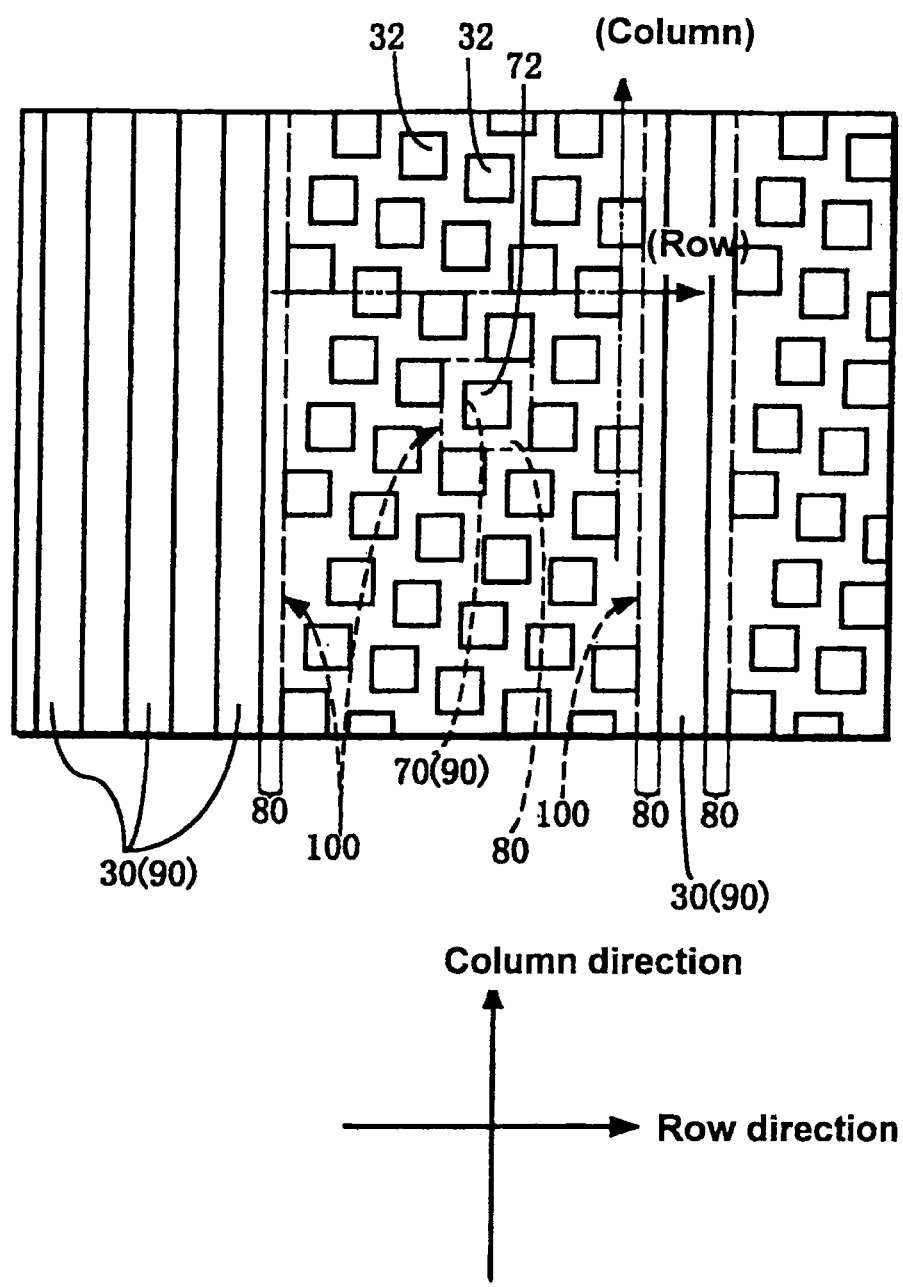
FIG. 3 shows a plan view of a surface at a level where first wiring layers are formed.

A pattern in plan view at a level where the first wiring layers 30 are formed is described below. FIG. 3 is a plan view of the level where the first wiring layers 30 are formed.

Prohibited areas 80 are set around the first wiring layers 30 and the second contact hole 70 (i.e., an area where the second contact layer 72 is formed). It is noted that the first wiring layers 30 and the second contact hole 70 define wiring effective regions 90. Furthermore, the wiring effective regions 90 and the prohibited areas 80 define restriction regions 100.

The prohibited areas 80 are regions that do not allow the dummy wiring layers 32 to be generated. The width of the prohibited area 80 is determined in consideration of circuit design. For example, the prohibited area may have a width of 0.5-100 μm. When a semiconductor device does not use circuits that use electromagnetic effects, such as inductors using wiring layers, the prohibited area 80 may preferably have a width of 0.5-20 μm, and more preferably 1-5 μm. It is noted that the prohibited areas 80 may or may not have the same width along the entire prohibited areas 80. For example, all of the prohibited areas 80 around the first wiring layers 30 may have different widths. Alternatively, all of the prohibited areas 80 around the first wiring layers 30 may have the same width.

Dummy wiring layers 32 are formed in areas other than the restriction regions (including the wiring effective regions and the prohibited areas) 100. In other words, the dummy wiring layers 32 are formed in such a manner that the dummy wiring layers 32 do not overlap the restriction regions 100. More particularly, the dummy wiring layers 32 that entirely or partially overlap the restriction regions 100 are completely excluded. Advantages derived from completely excluding the dummy wiring layers 32 that may partially overlap the restriction regions 100 are described below.

The prohibited areas 80 are provided around the first wiring layers 32 and the second contact hole 70 because of the following reasons.

(1) First Wiring Layer

Unless the prohibited areas 80 are provided around the first wiring layers 30, dummy wiring layers 32 may be formed connected with the first wiring layers 30. In this case, for example, the wirings become wide or narrow in various places and thus have different resistance values at different places. When the wirings have different resistance values at different places, the designed wiring resistance values cannot be attained. As a result, device characteristics may vary. Also, due to the increased area of the wirings, the wirings may be readily short-circuited.

(2) Second Contact Hole

Unless the prohibited area 80 is provided around the second contact hole 70, a dummy wiring layer 32 may be formed in a region where the second contact hole 70 is formed. In this case, when the second interlayer dielectric layer 40 and the first interlayer dielectric layer 20 are etched to form the second contact hole 70, the dummy wiring layer 32 may function as an etching stopper layer for the first interlayer dielectric layer 20 such that the second contact hole 70 may not be formed.

Figure 4:
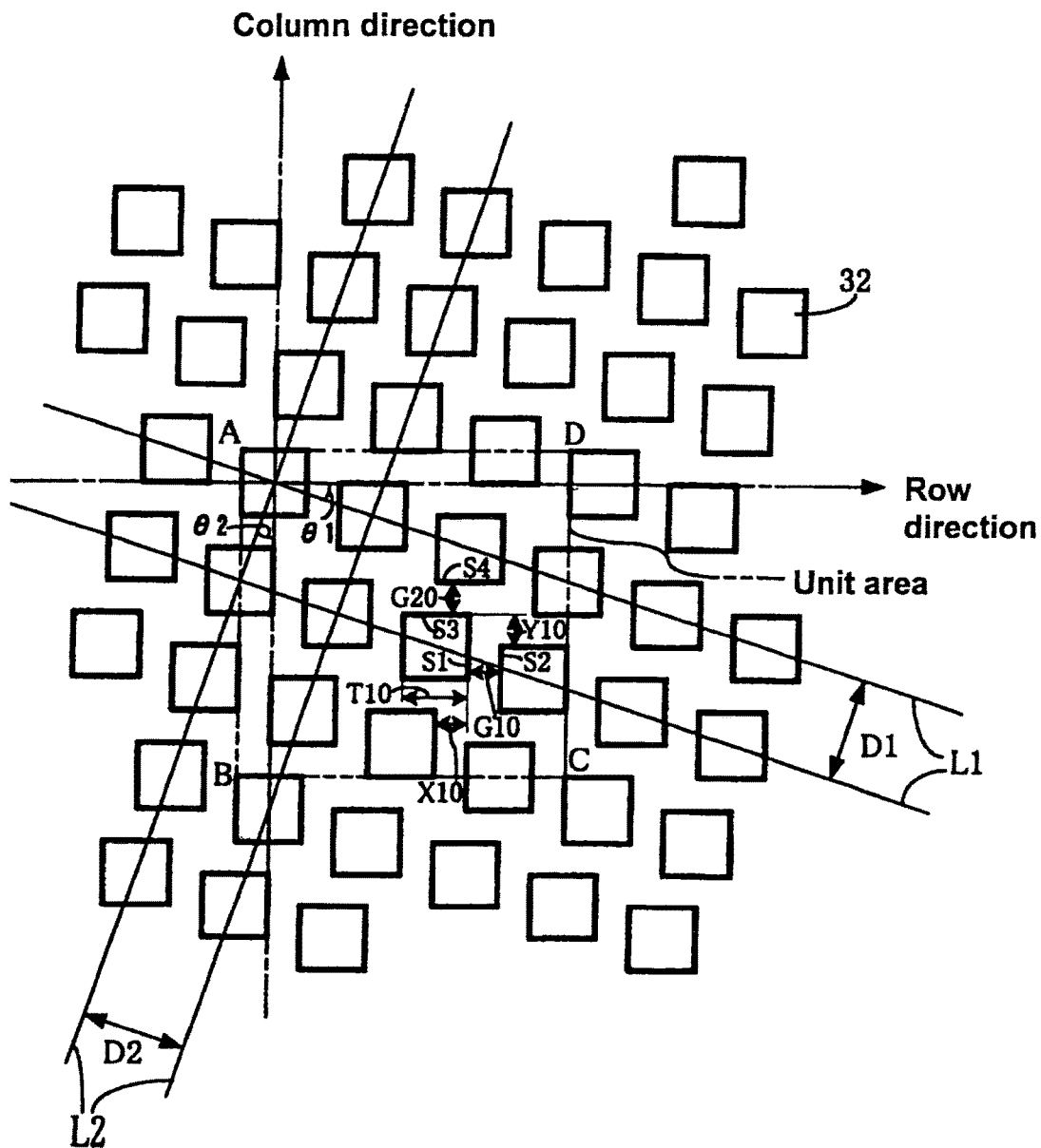
FIG. 4 schematically shows a plan view of patterns of dummy wiring layers.

Referring to FIG. 4, a disposition pattern of the dummy wiring layers 32 is described below.

The dummy wiring layers 32 are located on first virtual linear lines L1. In one embodiment, for example, the dummy wiring layers 32 may be formed in a manner that centers of the dummy wiring layers 32 are located on the first virtual linear lines L1.

The dummy wiring layers 32 are also formed in a manner to be located on second virtual linear lines L2. In one embodiment, for example, the dummy wiring layers 32 may be formed in a manner that centers of the dummy wiring layers 32 are located on the second virtual linear lines L2.

The dummy wiring layers 32 are disposed in a direction traversing a first matrix direction (for example, a direction of rows or a direction of columns in a matrix) and also disposed in a direction traversing a second matrix direction (for example, a direction of rows or a direction of columns in the matrix). The first matrix direction may perpendicularly traverse the second matrix direction.

The first virtual linear lines L1 traverse the row direction. The first virtual linear lines L1 and the row direction define an angle θ1 that is 2-40 degrees. Preferably, the angle θ1 is 15-25 degrees. More preferably, the angle θ1 is about 20 degrees. The "row direction" used here refers to one direction that is virtually defined in view of, for example, the first wiring layers 30, the second contact hole 70, and the prohibited areas 80.

The second virtual linear lines L2 traverse the column direction. The second virtual linear lines L2 and the column direction define an angle θ2 that is 2-40 degrees. Preferably, the angle θ2 is 15-25 degrees. More preferably, the angle θ2 is about 20 degrees. The "column direction" used here refers to one direction that is virtually defined, for example, in consideration of the first wiring layers 30, the second contact hole 70, and the prohibited areas 80.

The first virtual linear lines L1 are defined in plurality. The first virtual linear lines L1 are defined to be separated from one another at a specified pitch. The first virtual linear lines L1 may be separated from one another by any distance. However, in a preferred embodiment, adjacent ones of the first virtual linear lines L1 may be separated from one another by a gap of, for example, about 1-16 μm, and more preferably 2-5 μm. The second virtual linear lines L2 are defined in plurality. The second virtual linear lines L2 are defined to be separated from one another at a specified pitch. The second virtual linear lines L2 may be separated from one another by any distance. However, in a preferred embodiment, adjacent ones of the second virtual linear lines L2 may be separated from one another by a gap of, for example, 1-16 μm, and more preferably 2-5 μm.

Adjacent ones of the dummy wiring layers 32 disposed next to one another on each one of the first virtual linear lines L1 are mutually offset in the column direction. The dummy wiring layers 32 may be offset in the column direction by a width Y10. In one embodiment, the width Y10 is 0.5-5 μm. In a preferred embodiment, the width Y10 is 0.5-2 μm, and more preferably about 1 μm.

Adjacent ones of the dummy wiring layers 32 disposed next to one another on each one of the second virtual linear lines L2 are mutually offset in the row direction. The dummy wiring layers 32 may be offset in the row direction by a width X10. In one embodiment, the width X10 is about 0.5-5 μm. In a preferred embodiment, the width X10 is 0.5-2 μm, and more preferably about 1 μm.

In a plan configuration, a ratio of an area occupied by the dummy wiring layers 32 with respect to a unit area is not particularly limited. However, in a preferred embodiment, the area occupied by the dummy wiring layers 32 in a unit area is 30-50%, and more preferably about 40%. In one embodiment, the area occupied by the dummy wiring layers 32 in a unit area may preferably be 30-50%, and more preferably about 40%.

The "unit area" used here is the minimum unit area that can be repeated in an up-to-down direction and right-to-left direction to form the entire pattern. In one embodiment, a unit area is defined by a rectangle ABCD shown in FIG. 4.

The configuration in plan view of the dummy wiring layer 32 is not particularly limited. For example, the dummy wiring layer 32 may have a polygonal shape in plan view or a circular shape in plan view. In one embodiment, the dummy wiring layer 32 may have a polygonal shape in plan view. Preferably, the dummy wiring layer 32 may have a rectangular shape in plan view, and more preferably a square shape in plan view. When the dummy wiring layers 32 each have a generally square shape in plan view, the dummy wiring layers 32 can be more densely formed. For example, the dummy wiring layers 32 can be more securely formed even in an area adjacent to a crossing area where prohibited areas cross each other at right angles. As a result, the dummy wiring layers 32 can be more effectively formed in an area adjacent to a prohibited area formed with a complex pattern (for example, a prohibited area around a wiring layer that is formed with a complex pattern).

When the configuration in plan view of the dummy wiring layer 32 is generally square, the length T10 of each side of the dummy wiring layer 32 is not particularly limited. However, for example, the length of each side of the dummy wiring layer 32 may be 1-10 μm. Preferably, the length of each side of the dummy wiring layer 32 may be about 2 μm. When the length T10 of each side of each of the dummy wiring layers 32 is about 1 μm or greater, the amount of data for generating a mask, which is used to form the dummy wiring layers 32, is prevented from substantially increasing. When the length T10 of each side of each of the dummy wiring layers 32 is 10 µm or shorter, the dummy wiring layers can be formed in a space between wiring layers that are separated from one another by at least 10 µm, where step differences in an interlayer dielectric layer over the wiring layers are readily formed. Therefore, step differences in the interlayer dielectric layer can be effectively eliminated.

When the configuration in plan view of the dummy wiring layer 32 is generally square, adjacent ones of the dummy wiring layers 32 disposed next to one another on the same one of the first virtual linear lines L1 have sides S1 and S2 that partially oppose to one another. A gap G10 between the partially opposing sides S1 and S2 is not particularly limited to a specific range. However, the gap G10 may preferably be 0.5-5 µm, and more preferably about 1 µm. Also, the gap G10 may preferably be set shorter than the side length T10 of each of the dummy wiring layers 32. More preferably, the gap G10 may be about a half of the side length T10 of each of the dummy wiring layers 32.

When the configuration in plan view of the dummy wiring layer 32 is generally square, adjacent ones of the dummy wiring layers 32 disposed next to one another on the same one of the second virtual linear lines L2 have sides S3 and S4 that partially oppose to one another. A gap G20 between the partially opposing sides S3 and S4 is not particularly limited to a specific range. However, the gap G20 may preferably be 0.5-5 µm, and more preferably about 1 µm. Also, the gap G20 may preferably be set shorter than the side length T10 of each of the dummy wiring layers 32. More preferably, the gap G20 may be about a half of the side length T10 of each the dummy wiring layers 32.

When the configuration in plan view of the dummy wiring layer 32 is generally square, adjacent ones of the dummy wiring layers 32 disposed next to one another in the row direction are offset by a width Y10 in the column direction. The width Y10 may preferably be about a half of the length of each side of the dummy wiring layer 32. Also, adjacent ones of the dummy wiring layers 32 disposed next to one another in the column direction are offset by a width X10 in the row direction. The width X10 may preferably be about a half of the length of each edge of the dummy wiring layer 32.

The dummy wiring layers 32 having the configurations described above provide at least the following effects. The effects obtained by the above-described configurations of the dummy wiring layers 32 will be described below with reference to FIG. 5.

Figure 5:
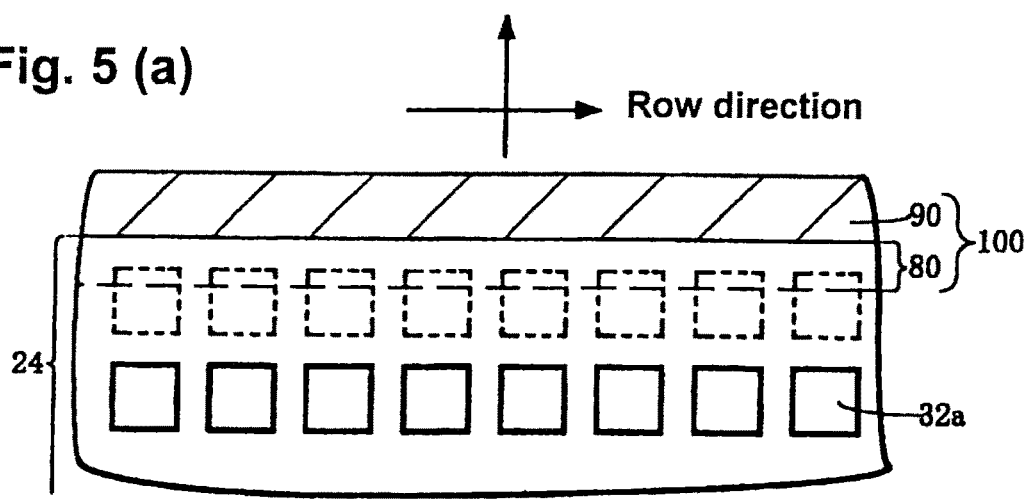
FIGS. 5 (a) and 5 (b) schematically show plan view of patterns of dummy wiring layers adjacent to prohibited areas.
Figure 5:
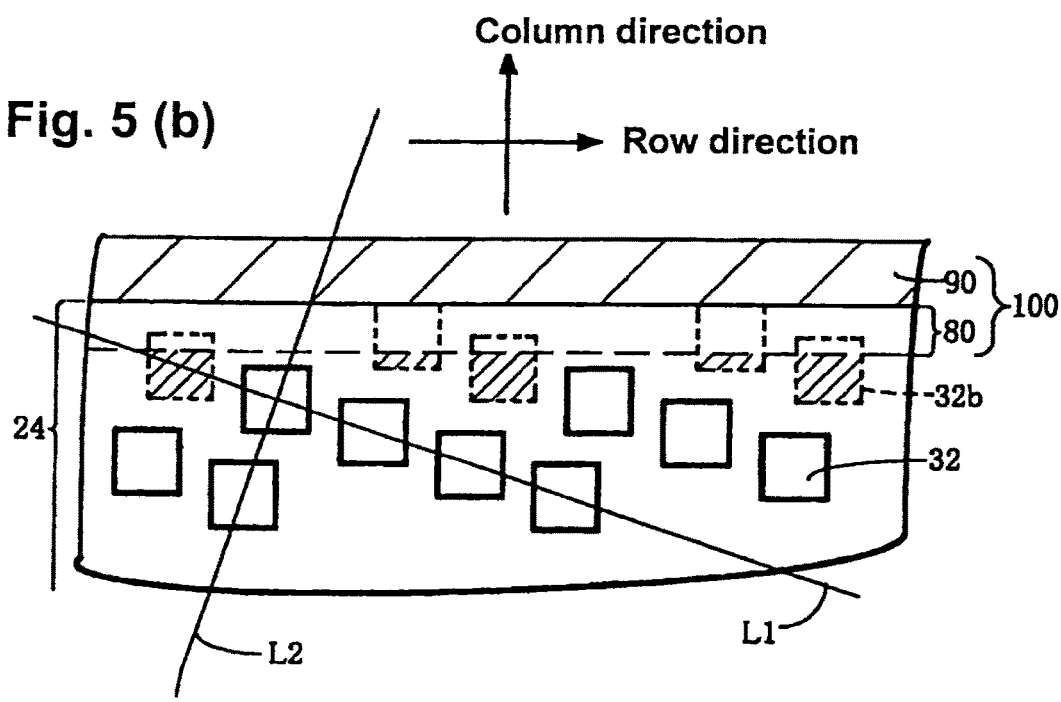

(1) For example, let us consider one case in which a restriction region 100 is provided in a manner shown in FIG. 5 (a). The restriction region 100 includes a wiring effective region 90 and a prohibited area 80. The prohibited area 80 extends in the row direction about the wiring effective region 90. Let us consider one situation in which dummy wiring layers 32a in a lattice structure are formed in parallel with the restriction region 100. When the dummy wiring layers 32a are formed in a lattice structure in parallel with the restriction region 40, and if any one of the dummy wiring layers 32a in one of the rows of the lattice overlaps the restriction region 100, all the other dummy wiring layers 32a in the same row overlap the restriction region 100. In order to form dummy wiring layers 32a adjacent to the restriction region 100 while preventing the dummy wiring layers 32a from overlapping the restriction region 100, the location of the dummy wiring layers 32a needs to be controlled. Such a control is technically difficult because it may cause a substantial increase in the amount of data for generating masks. On the other hand, when dummy wiring layers 32a cannot be formed adjacent to the restriction region 100, the density of the dummy wiring layers 32a formed in an area adjacent to the restriction region 100 becomes insufficient.

However, in accordance with the embodiments of the present invention, as shown in FIG. 5 (b), the dummy wiring layers 32 are disposed on the first virtual linear lines L1 that extend in a direction traversing the row direction. In other words, adjacent ones of the dummy wiring layers 32 disposed next to one another on the same one of the first virtual linear lines L1 are mutually offset in the column direction. As a result, even when one of the dummy wiring layers 32 disposed on one of the first virtual linear lines L1 overlaps the restriction region 100, the next one of the dummy wiring layers 32 on the same first virtual linear line L1 can be disposed without overlapping the restriction region 100. As a result, the dummy wiring layers 32a can be securely formed in an area adjacent to the restriction region 100 without substantially controlling the locations where the dummy wiring layer 32 are formed.

Also, in accordance with the embodiments of the present invention, the dummy wiring layers 32 are disposed on the second virtual linear lines L2 that extend in a direction traversing the column direction. In other words, adjacent ones of the dummy wiring layers 32 disposed next to one another on the same one of the second virtual linear lines L2 are mutually off set in the row direction. As a result, even when one of the dummy wiring layers 32 disposed on one of the second virtual linear lines L2 overlaps the restriction region 100, the next one of the dummy wiring layers 32 on the same second virtual linear line L2 can be disposed without overlapping the restriction region 100. Accordingly, the dummy wiring layers 32 can be securely formed in areas adjacent to the restriction region 100 that extends in the column direction.

(2) In the semiconductor device in accordance with the embodiments of the present invention, dummy wiring layers 32 that partially overlap a restriction region 100 are entirely eliminated. As a result, the following effects are obtained If dummy wiring layers 32 partially overlap a restriction region 100, portions (hatched areas) 32b of the dummy wiring layers 32 do not overlap the restriction region 100. The portions 32b are hereafter referred to as "hangover dummy wiring layers". The hangover dummy wiring layer 32b has a shape in plan view that lacks a portion of the plan shape of the original dummy wiring layer 32. In other words, the hangover dummy wiring layer 32b has a smaller plan area compared to a plan area of the original dummy wiring layer 32. When the hangover dummy wiring layer 32b is extremely small in plan area (for example, when it is smaller than the resolution limit or the design rule), the following problems may occur.

(a) A resist layer to define the hangover dummy wiring layers 32b is difficult to form, and pattern skipping of the pattern for the hangover dummy wiring layers 32b occurs. (b) Even if a resist layer to define the hangover dummy wiring layers 32b is formed, the resist layer may fall. The fallen resist layer becomes dusts in an etching step to form the first wiring layers 30, and therefore deteriorates the etching step. (c) Convex portions of the hangover dummy wiring layers 32b are very narrow, and therefore may break in a washing step to be conducted after the wiring layers are patterned. The broken convex portions become foreign particles that may remain on the surface of the substrate. (d) If the foreign particles on the surface enter a dielectric layer, wiring layers may become short-circuited.

In accordance with the embodiments of the present invention, any hangover dummy wiring layers 32b are not formed. As a result, the occurrence of the problems described above is securely prevented.

Figure 13:
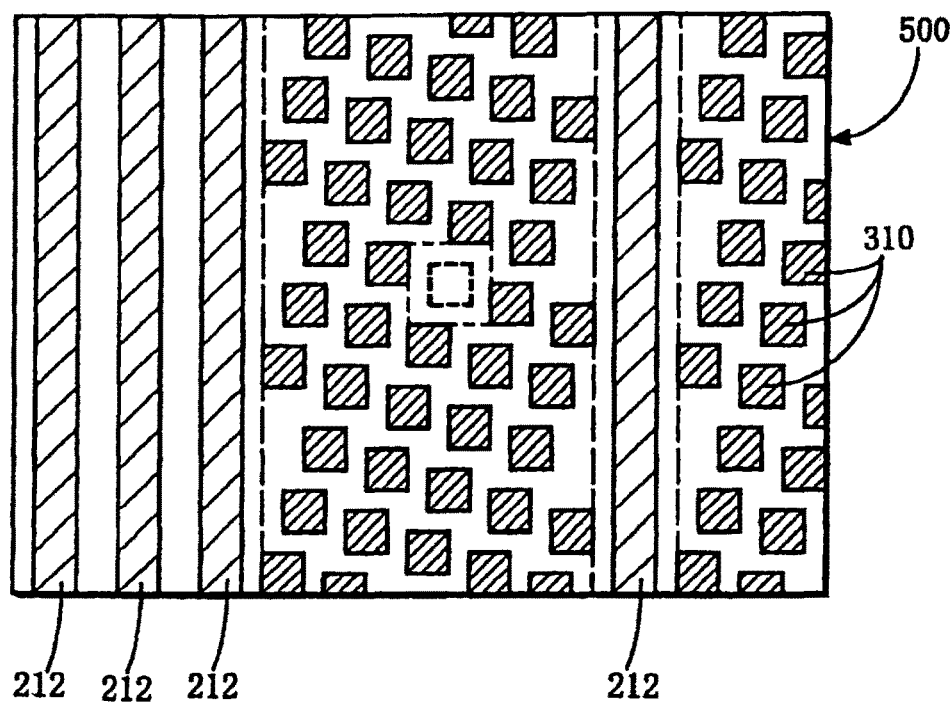
FIG. 13 shows a figure representing mask data.

One example of a method for generating mask data is described below. The mask data is used for forming first wiring layers and dummy wiring layers. The mask data can be generated using a computer. FIG. 13 shows a pattern representing a mask data set.

Figure 6:
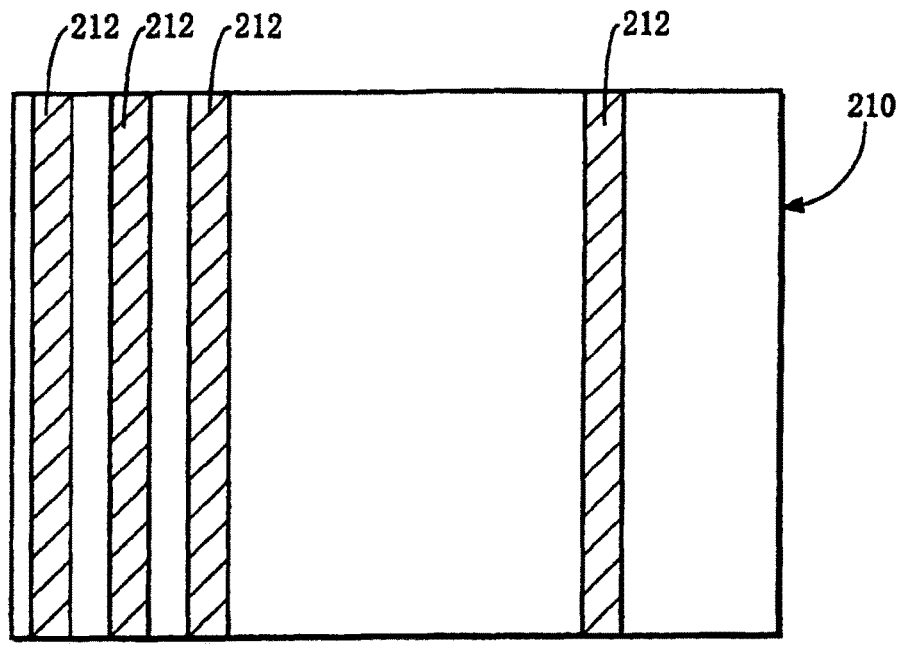
FIGS. 6 (a) and 6 (b) show intermediate mask data representing patterns used in a process for forming first mask data.
Figure 6:
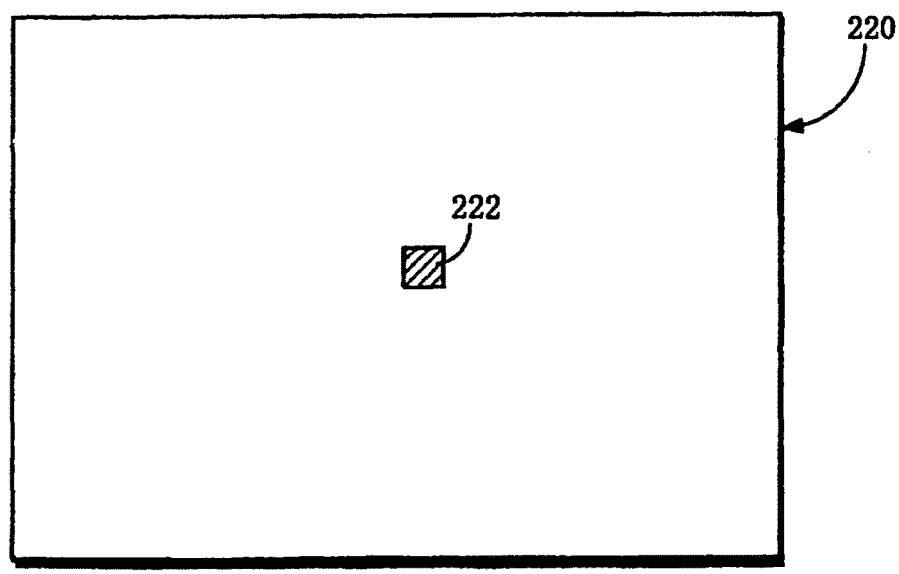
Figure 7:
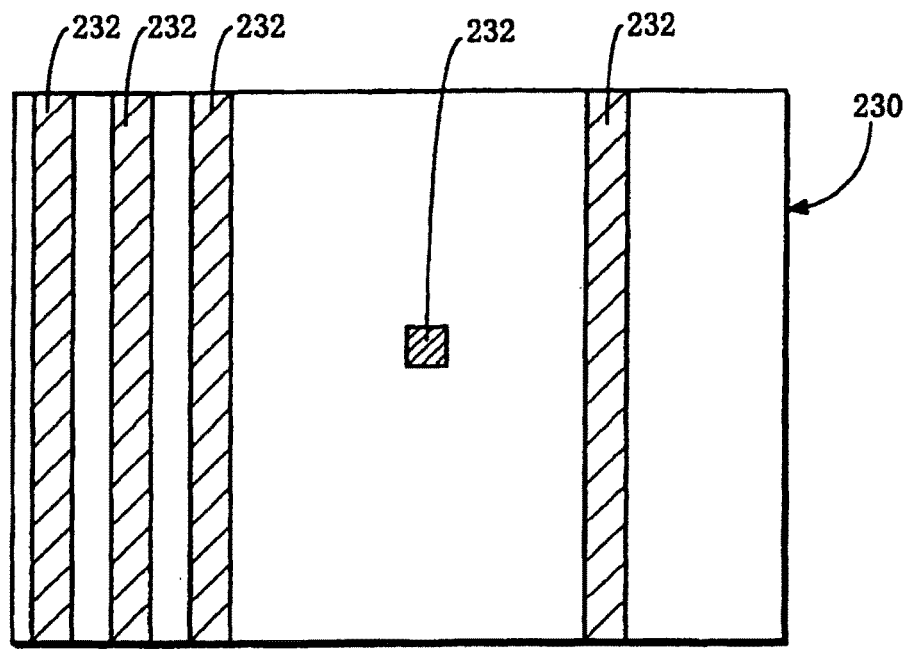
FIG. 7 shows an intermediate mask data representing one pattern used in the process for forming the first mask data.
Figure 8:
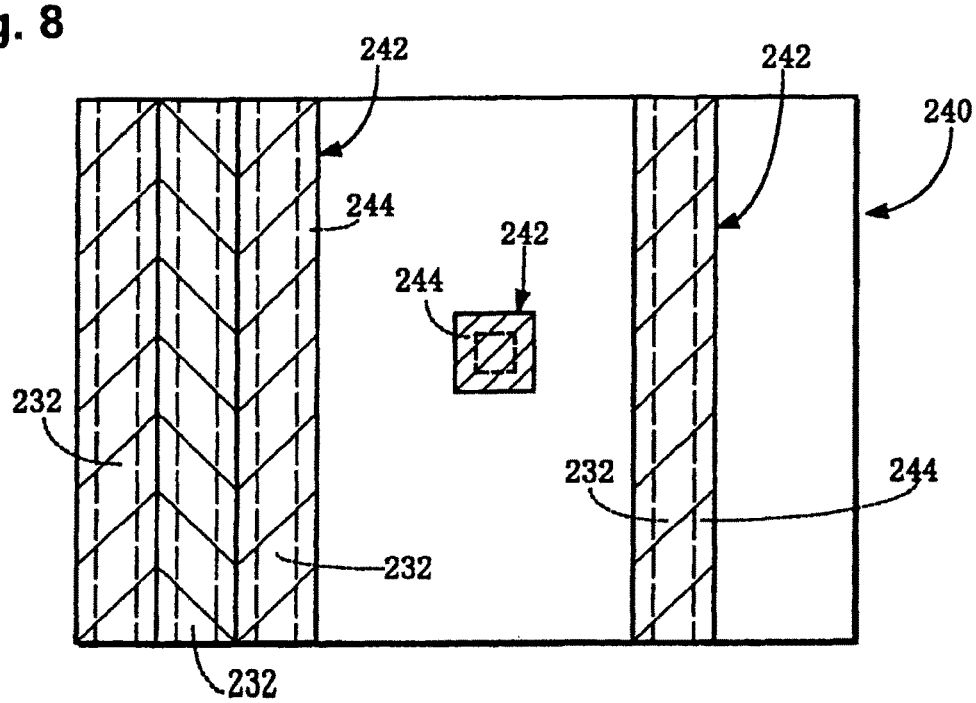
FIG. 8 shows an intermediate mask data representing one pattern used in the process for forming the first mask data.
Figure 9:
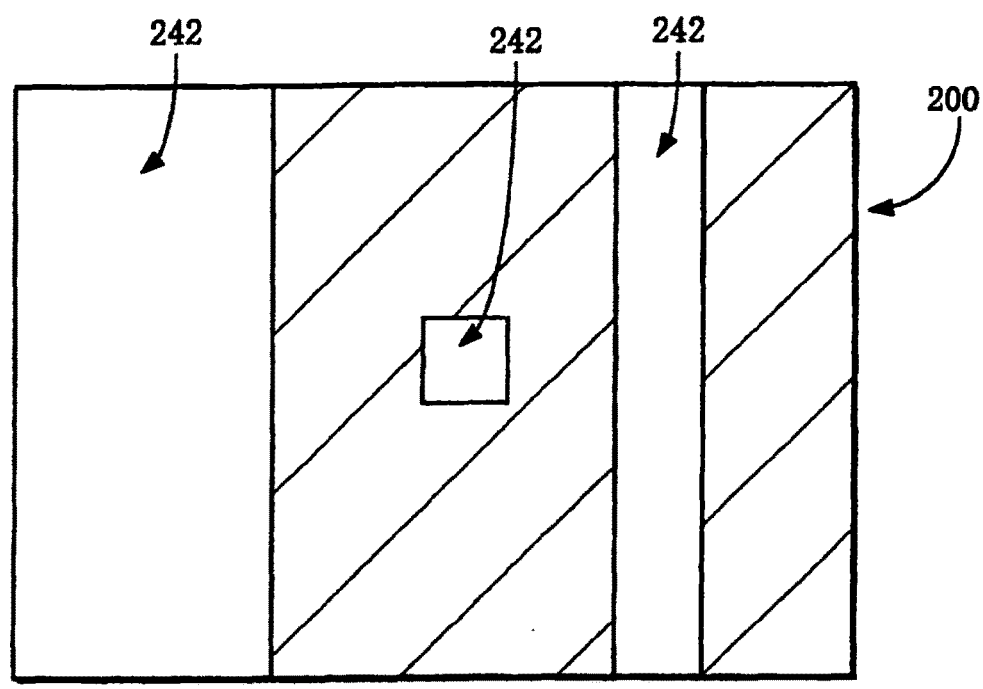
FIG. 9 shows a figure representing the first mask data.

First, data for a first mask is generated. FIG. 9 shows a pattern representing first mask data 200. Restriction region patterns 242 that define restriction regions are set in the first mask data 200. In one embodiment, the first mask data 200 is formed in a manner described below. FIGS. 6-8 show steps of forming the first mask data that include intermediate mask data sets.

Initially, first and second intermediate mask data 210 and 220, which represent regions shown in FIGS. 6 (a) and 6 (b), respectively, are prepared.

Wiring patterns 212 are defined in the first intermediate mask data 210 in a manner shown in FIG. 6 (a). The wiring patterns 212 define first wiring layers. A second contact hole pattern 222 is defined in the second intermediate mask data 220 in a manner shown in FIG. 6 (b). The second contact hole pattern 222 defines a second contact hole.

Then, a logical sum of the first and second intermediate mask data 210 and 220 is made to obtain third intermediate mask data 230 shown in FIG. 7. In other words, the hatched regions 212 and 222 of the first and second intermediate mask data 210 and 220 are added to define wiring effective region patterns 232 in the third intermediate mask data 230. The wiring effective region patterns 232 define wiring effective regions.

Then, the wiring effective region patterns 232 are expanded by a specified width to obtain fourth intermediate mask data 240 shown in FIG. 8. In other words, prohibited area patterns 244 are added around the wiring effective region patterns 232 to set the restriction region patterns 242. The prohibited area patterns 244 define prohibited areas. The restriction region patterns 222 define restriction regions.

Then, the fourth intermediate mask data 240 is diagrammatically reversed to obtain the first mask data 200 shown in FIG. 9. More particularly, the hatched regions in the fourth intermediate mask data 240 are changed to blank regions, and the blank regions in the fourth intermediate mask data 240 are replaced with hatched regions, to generate the first mask data 200.

Figure 10:
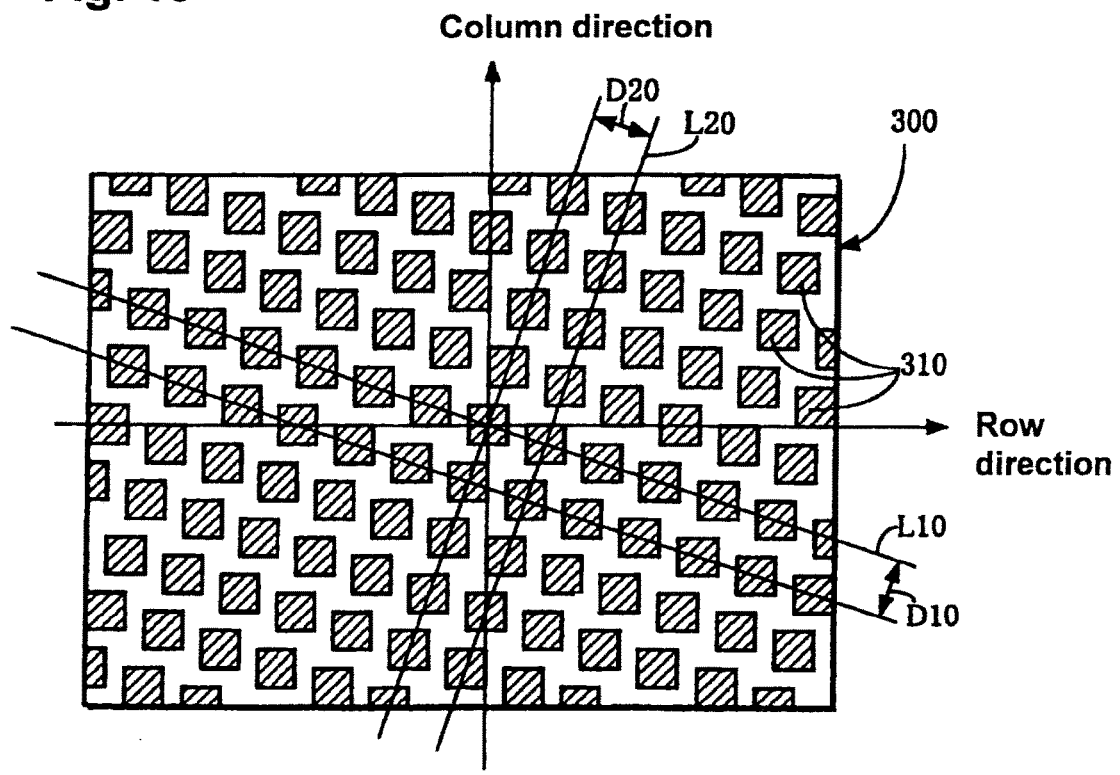
FIG. 10 shows a figure representing second mask data.
Figure 11:
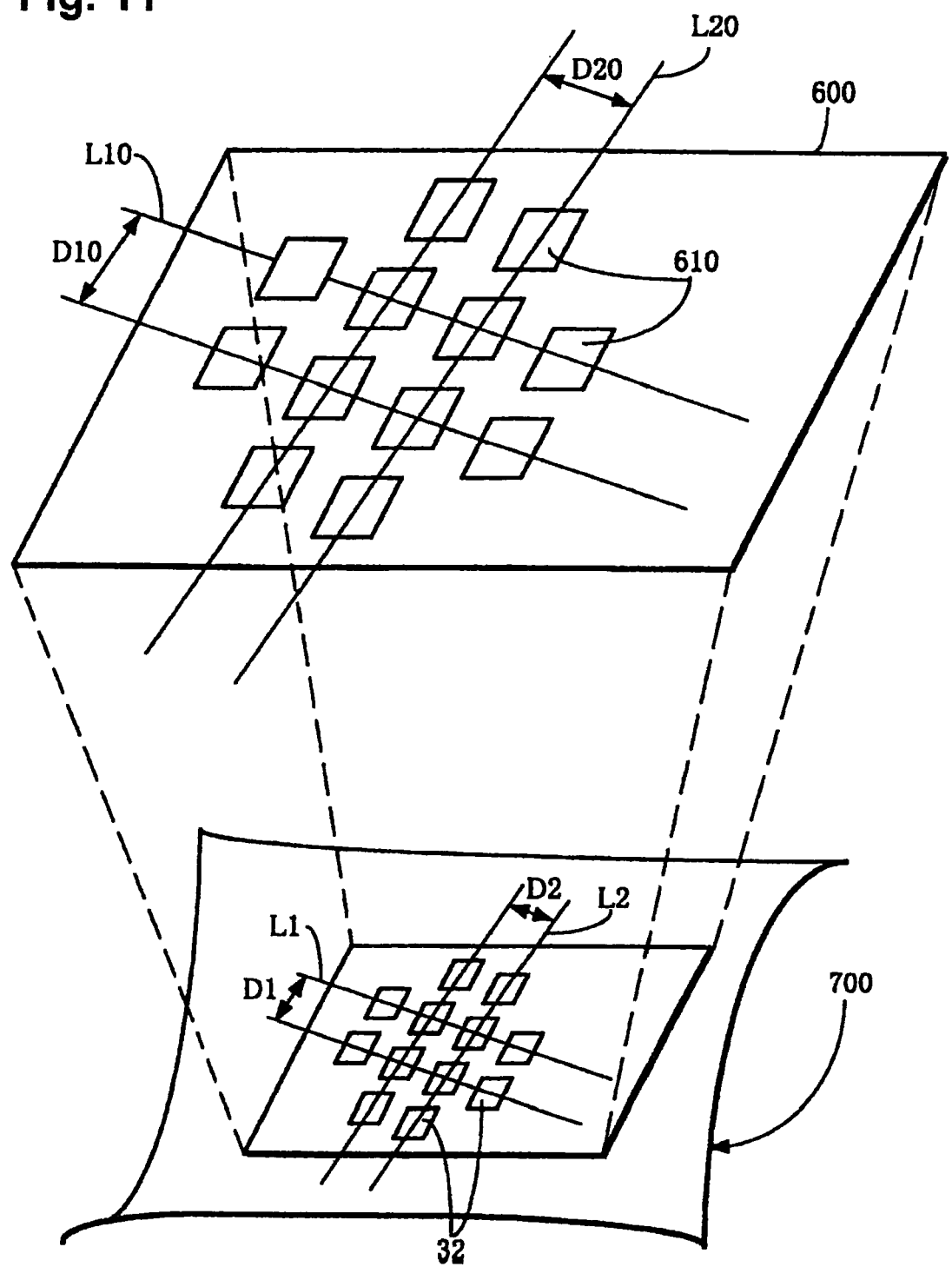
FIG. 11 shows figures indicating the relation between dummy patterns in a mask and patterns of dummy wiring layers in a semiconductor device when the mask is formed based on the second mask data.

Next, second mask data 300 is formed. FIG. 10 shows a pattern representing the second mask data 300. Dummy patterns 310 are defined in the second mask data 300. The dummy patterns 310 correspond to the patterns of the above-described dummy wiring layers 32 and thus define the dummy wiring layers 32. In other words, the dummy patterns 310 and placement patterns of the dummy wiring layers 32 are identical or approximate to one another. More particularly, as shown in FIG. 11, when a mask 600 having dummy patterns 610 is formed based on the second mask data 300, the dummy patterns 610 of the mask 600 correspond to the patterns of the dummy wiring layers 32 to be formed in a semiconductor device 700.

In a preferred embodiment, the dummy patterns 310 are disposed in the following manner.

The dummy patterns 310 are formed in a manner to be located on first virtual linear lines L10. The dummy patterns 310 can be formed in a manner that centers of the dummy patterns 310 are located on the first virtual linear lines L10. Also, the dummy patterns 310 can be formed in a manner that portions other than the centers of the dummy patterns 310 are located on the first virtual linear lines L10. In other words, the dummy patterns 310 are accepted as long as they are located on the first virtual linear lines L10.

The dummy patterns 310 are formed in a manner to be located on second virtual linear lines L20. The dummy patterns 310 may be formed in a manner that centers of the dummy patterns 310 are located on the second virtual linear lines L20. Also, the dummy patterns 310 may be formed in a manner that portions other than the centers of the dummy patterns 310 are located on the second virtual linear lines L20. In other words, the dummy patterns 310 are accepted as long as they are located on the second virtual linear lines L20.

The first virtual linear lines L10 traverse the row direction. The first virtual linear lines L10 and the row direction define an angle θ10 that is 2-40 degrees. Preferably, the angle θ10 is 15-25 degrees. More preferably, the angle θ10 is about 20 degrees. The "row direction" used here refers to one direction that is virtually defined in view of, for example, the wiring patterns, the second contact hole pattern, and the prohibited area patterns.

The second virtual linear lines L20 traverse the column direction. The second virtual linear lines L20 and the column direction define an angle θ20 that is 2-40 degrees. Preferably, the angle θ20 is 15-25 degrees. More preferably, the angle θ20 is about 20 degrees. The "column direction" used here refers to one direction that perpendicularly traverses the row direction and is virtually defined in view of, for example, the wiring patterns, the second contact hole pattern, and the prohibited area patterns.

The first virtual linear lines L10 are defined in plurality. The first virtual linear lines L1 are defined to be separated from one another at a specified pitch. The second virtual linear lines L2 are defined in plurality. The second virtual linear lines L2 are defined to be separated from one another at a specified pitch. A gap D10 between adjacent ones of the first virtual linear lines L10 is set such that a gap D1 between adjacent ones of the first virtual linear lines L1 in a semiconductor device acquires a designed amount (see FIG. 11). Also, a gap D20 between adjacent ones of the second virtual linear lines L20 is set such that a gap D2 between adjacent ones of the second virtual linear lines L2 in the semiconductor device acquires a designed amount (see FIG. 11).

It is noted that the second mask data 300 can be formed before the first mask data 200 is formed.

Figure 12:
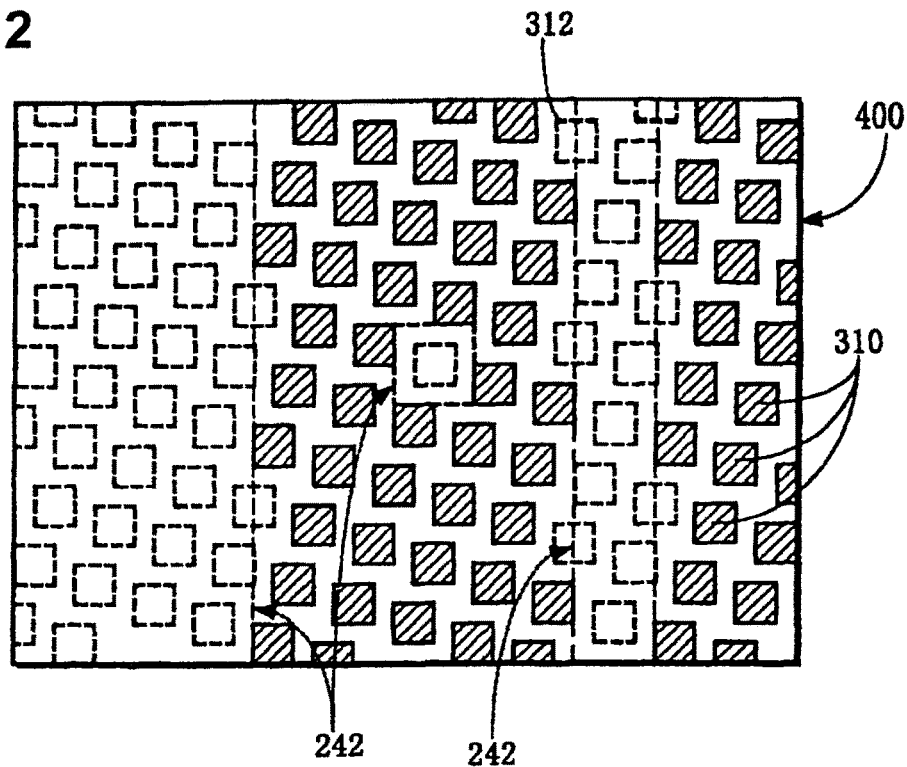
FIG. 12 shows a figure representing third mask data.

Next, the first mask data 200 and the second mask data 300 are mixed to form a third mask data 400. FIG. 12 shows a pattern representing the third mask data 400. For example, the first and second mask data 200 and 300 can be mixed in the following manner. Common areas of the hatched regions in the first mask data 200 and the dummy patterns (hatched regions) 310 of the second mask data 300 are extracted. In other words, the dummy patterns 310 that overlap the restriction region patterns 242 are excluded. It is noted that the dummy patterns 312 that partially overlap the restriction region patterns 242 are also entirely excluded.

Then, a logical sum of the third mask data 400 and the first intermediate mask data 210 is obtained. In other words, the wiring patterns (hatched regions) 212 of the first intermediate mask data 210 are added to the third mask data 400. As a result, mask data 500 shown in FIG. 13 is obtained for a mask that is used to form the first wiring layers and the dummy wiring layers.

When a positive type resist is used for patterning the wiring layers, the hatched regions of the mask data 500 represent shading portions of the mask (for example, chrome patterns). When a negative type resist is used, regions other than the hatched regions (i.e., blank regions) of the mask data 500 represent shading portions of the mask (for example, chrome patterns).

The mask data 500 thus obtained can be recorded in a computer readable recording media if required. Also, a mask that is used to form the first wiring layers and the dummy wiring layers can be obtained based on the mask data 500.

In the method for generating mask data in accordance with the embodiments of the present invention, the dummy patterns 310 correspond to placement patterns of the dummy wiring layers 32 as described above. As a result, for the same reasons described above in conjunction with the effects of the semiconductor device in accordance with the embodiment of the present invention, the dummy patterns 310 can be securely generated in areas adjacent to the restriction regions 24 without controlling placement positions of the dummy patterns 310. In other words, the dummy patterns 310 can be automatically generated in areas adjacent to the restriction region patterns 242. As a result, when a mask is obtained by the method for generating mask data in accordance with the embodiments of the present invention, and such a mask is used to form dummy wiring layers, the dummy wiring layers can be securely formed in areas adjacent to restriction regions. Accordingly, when a dielectric layer formed over the wiring layers is polished, the polishing pressure is securely distributed on the dummy wiring layers in areas adjacent to the restriction regions.

Also, the dummy patterns 310 that at least partially overlap the restriction region patterns 242 are entirely excluded. As a result, the generation of pattern skipping of patterns of dummy wiring layers can be securely prevented.

Furthermore, since the dummy patterns 310 can be securely set in areas adjacent to the restriction region patterns 242, the dummy patterns 310 can also be securely set in regions where gaps between adjacent restriction region patterns 242 are narrow.

In accordance with the embodiments of the present invention, the step of generating the first mask data 200 includes the step of diagrammatically reversing the fourth intermediate mask data 240. However, depending on software used for generating mask data, the step of diagrammatically reversing the fourth intermediate mask data 240 may not necessarily be included.

Figure 14:
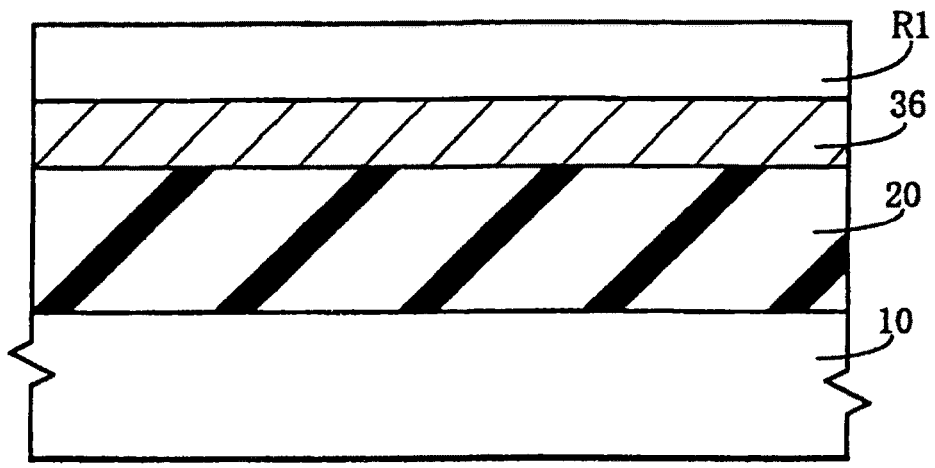
FIG. 14 (a)-14 (c) schematically show in cross section of a semiconductor device in different manufacturing steps.
Figure 14:
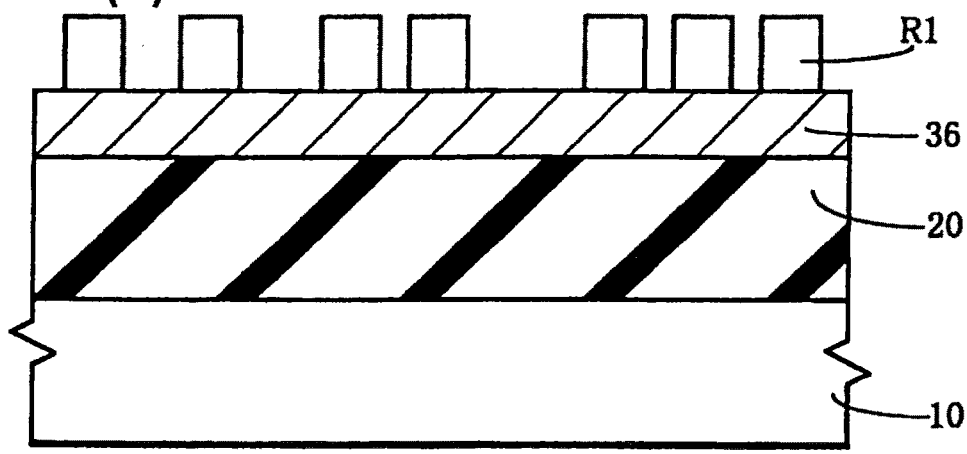
Figure 14:
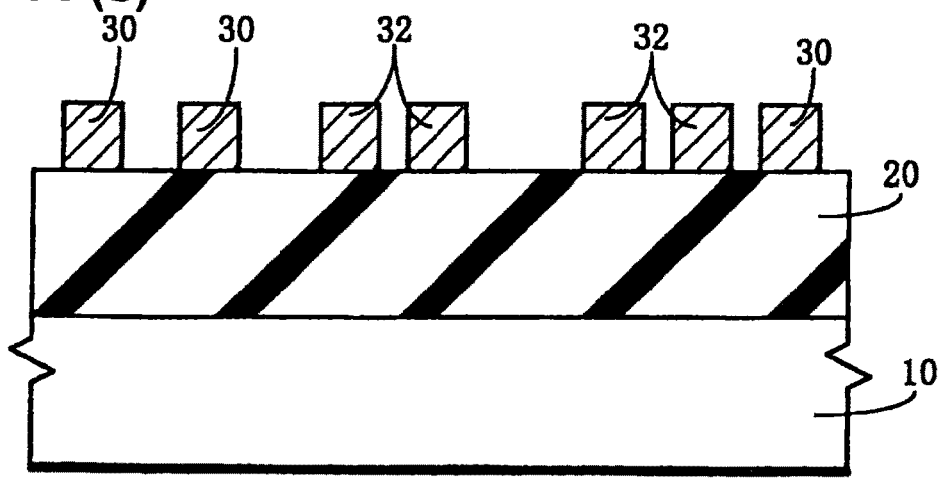
Figure 15:
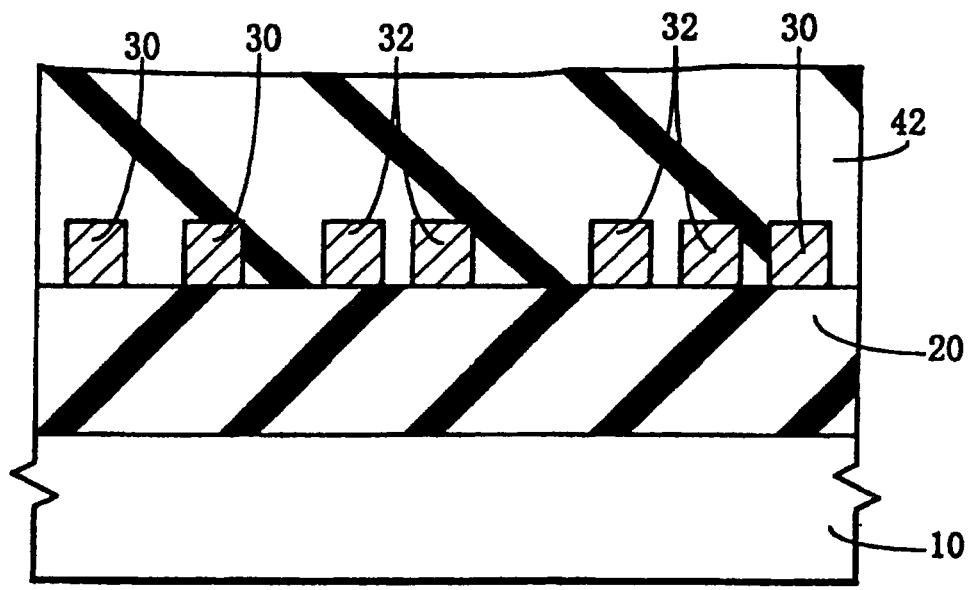
FIGS. 15 (a) and 15 (b) schematically show in cross section of the semiconductor device in different manufacturing steps.
Figure 15:
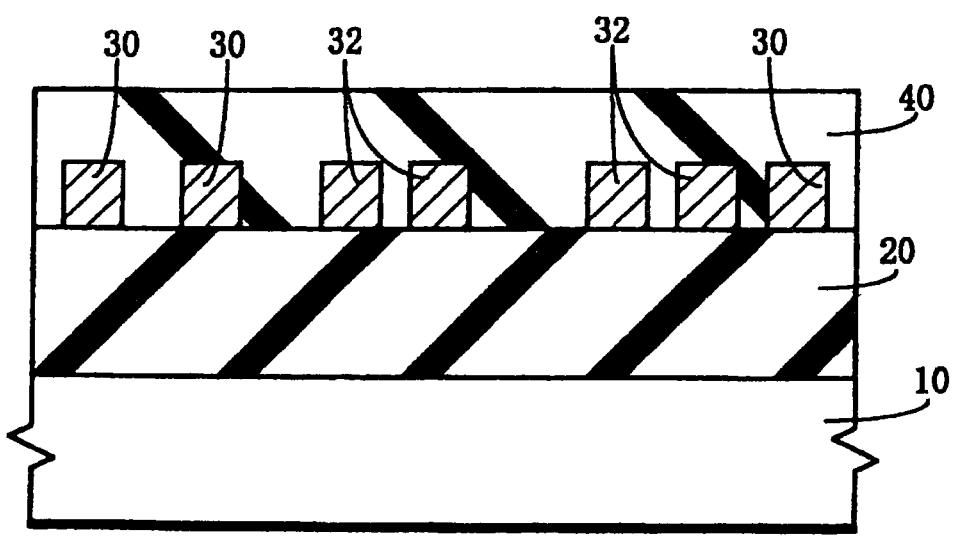

Next, a method for manufacturing a semiconductor device in accordance with an embodiment of the present invention will be described. FIGS. 14 and 15 schematically show cross sections of a semiconductor device in manufacturing process steps.

(1) Referring to FIG. 14 (*a*), semiconductor elements (for example, MOSFETs), wiring layers, and element isolation regions (not shown) are formed over a silicon substrate 10 by a known method.

Then, a first interlayer dielectric layer 20 is formed over the semiconductor substrate 10. The first interlayer dielectric layer 20 may be formed in the same manner as a second interlayer dielectric layer 40 (to be described below) is formed. The thickness of the first interlayer dielectric layer 20 is not limited to a specific range. For example, the thickness of the first interlayer dielectric layer 20 is about 300 nm-1000 nm. The first interlayer dielectric layer 20 can be planarized by a chemical-mechanical polishing (CMP) method depending on requirements.

Contact holes (not shown) are formed in the first interlayer dielectric layer 20. For example, the contact holes are formed by an anisotropic reactive ion etching. Contact layers (not shown) are formed in the contact holes by a known method. The contact layers are formed from, for example, tungsten plugs or aluminum alloy layers.

A conductive layer 36 is formed over the first interlayer dielectric layer 20. The conductive layer 36 is not limited to a specific material. For example, an alloy of aluminum and copper, titanium nitride, titanium can be used for the conductive layer 36. The conductive layer 36 may be formed by an appropriate method, for example, a sputtering method. The thickness of the conductive layer 36 may be appropriately selected depending on device designs. For example, the thickness of the conductive layer 36 is about 50-700 nm.

Next, a resist layer R1 is formed over the conductive layer 36.

(2) Then, the resist layer R1 is exposed and developed to thereby pattern the resist layer R1 as shown in FIG. 14 (*b*). A mask that is used for exposing the resist layer R1 is manufactured based on the mask data obtained by the method for generating mask data in accordance with the present invention. It is noted that an area above a forming region where a second contact hole 70 is to be formed is not opened.

(3) Then, as shown in FIG. 14 (*c*), the conductive layer 36 is etched using the resist layer R1 to thereby form first wiring layers 30 and dummy wiring layers 32 having specified patterns.

Then, as shown in FIG. 15 (*a*), a dielectric layer 42 is formed over the first interlayer dielectric layer 20, the first wiring layers 30 and the dummy wiring layers 32. The dielectric layer 42 may be formed from, for example, silicon oxide. When the dielectric layer 42 is formed from silicon oxide, the silicon oxide may contain phosphorous, boron or the like. The dielectric layer 42 may be formed by, for example, a CVD method, a coating method. The thickness of the dielectric layer 42 is not limited to a specific range or value. For example, the thickness of the dielectric layer 42 is about 500-2000 nm.

Then, the dielectric layer 42 is polished by a CMP method to planarize the dielectric layer 42 to form a second interlayer dielectric layer 40 shown in FIG. 15 (*b*). The thickness of the resultant second interlayer dielectric layer 40 may vary depending on device designs, and may be, for example, 200-600 nm. The following effects are achieved when the dielectric layer 42 is planarized. Namely, the dummy wiring layers 32 are formed with the placement pattern that is described above in connection with the semiconductor device in accordance with the embodiment of the present invention. Accordingly, the dummy wiring layers 32 are securely formed in areas adjacent to the restriction regions. As a result, the polishing pressure can be more securely distributed over the dummy wiring layers 32 to the extent that the dummy wiring layers 32 are more securely formed in areas adjacent to the restriction regions. Thus, the polishing pressure can be better prevented from concentrating on the isolated first wiring layer 30, and therefore the dielectric layer 42 over the isolated first wiring layer 30 can be better prevented from being excessively cut. As a result, the second interlayer dielectric layer 40 can be better planarized.

Then, as shown in FIG. 2, second contact holes 70 (only one contact hole is shown in the figure) are formed in the first and second interlayer dielectric layers 20 and 40 at specified regions by photolithography and etching methods. Then, second contact layers 72 are formed in the second contact holes 70.

Then, first contact holes 60 (only one contact hole is shown in the figure) are formed in the second interlayer dielectric layer 40 at specified regions by photolithography and etching methods. Then, first contact layers 62 are formed in the first contact holes 60.

Next, a conductive layer is formed over the second interlayer dielectric layer 40, and the conductive layer is patterned to form second wiring layers 50, whereby a semiconductor device 1000 is completed.

Effects of the method for manufacturing semiconductor devices in accordance with the embodiment of the present invention will be described.

By the method for manufacturing a semiconductor device in accordance with the embodiment of the present invention, the dummy wiring layers 32 are formed with the same pattern of the dummy wiring layers 32 described above in conjunction with the structure of the semiconductor device. Accordingly, the dummy wiring layers 32 are securely formed in areas adjacent to the restriction regions. As a result, when the dielectric layer 42 is polished, the dielectric layer 42 over the isolated wiring layer 30 can be better prevented from being excessively cut. Thus, the second interlayer dielectric layer 40 can have a more uniform thickness.

Experiments are conducted to show how patterns of dummy wiring layers change the formation of the dummy wiring layers between wiring effective regions.

Conditions for embodiment samples will be described below.

(1) In accordance with one embodiment of the present invention, in an embodiment sample, placement patterns of dummy wiring layers are made according to the following rule:

(a) An angle between the first virtual linear lines and the row line is about 18.4 degrees.

(b) A gap between the adjacent first virtual linear lines is about 3.2 µm.

(c) An angle between the second virtual linear lines and the column line is about 18.4 degrees.

(d) A gap between the adjacent second virtual linear lines is about 3.2 µm.

(e) A ratio of an area of the dummy wiring layers occupied in a unit area is 40%.

(f) A shape of each of the dummy wiring layers in plan view is square.

(g) Each side of each of the dummy wiring layers in plan view has a length of 2 µm.

(h) A gap between opposing sides of adjacent ones of the dummy wiring layers disposed next to one another on the same one of the first virtual linear lines is 1 µm.

(i) A gap between opposing sides of adjacent ones of the dummy wiring layers disposed next to one another on the same one of the second virtual linear lines is 1 µm.

(j) An offset width in the column direction between opposing sides of adjacent ones of the dummy wiring layers disposed next to one another on the same one of the first virtual linear lines is 1 µm.

(k) An offset width in the row direction between opposing sides of adjacent ones of the dummy wiring layers disposed next to one another on the same one of the second virtual linear lines is 1 µm.

(l) The dummy wiring layers are formed such that their centers are located on the first virtual linear lines.

(m) The dummy wiring layers are formed such that their centers are located on the second virtual linear lines.

(n) Any dummy wiring layers that may entirely or partially overlap restriction regions 100 (including dummy wiring layers connecting to restriction regions) are excluded.

(2) The restriction regions 100 include wiring effective regions (wiring layers) 90 and prohibited areas 80 provided around the wiring effective regions (wiring layers) 90.

(3) The width of each of the prohibited areas 80 is 1 µm.

A region A10 and a region B10 are set. In the region A10, a gap between adjacent ones of the wiring effective regions (i.e., the wiring layers) 90 is 10 µm. In the region B10, a gap between adjacent ones of the wiring effective regions (i.e., the wiring layers) 90 is 6 µm.

Conditions for comparison samples will be described below.

(1) In a comparison sample, dummy wiring layers are disposed in the form of a lattice. More particularly, the dummy wiring layers are disposed according to the following rule:

(a) A gap between adjacent ones of the dummy wiring layers disposed next to one another in the row direction is 1 µm.

(b) A gap between adjacent ones of the dummy wiring layers disposed next to one another in the column direction is 1 µm.

(c) A shape of each of the dummy wiring layers in plan view is square.

(d) Each side of each of the dummy wiring layers in plan view has a length of 2 µm.

(e) Any dummy wiring layers that may entirely or partially overlap restriction regions 100 (including dummy wiring layers connecting to the restriction regions) are entirely excluded.

(2) The restriction regions 100 include wiring effective regions 90 and prohibited areas 80 provided around the wiring effective regions 90.

(3) The width of each of the prohibited areas 80 is 1 µm.

(4) The same patterns as those of the embodiment samples are used for patterns of the wiring effective regions (i.e., the wiring layers) 90. A region of the comparison sample corresponding to the region A10 of the embodiment sample is presented as B10, and a region of the comparison sample corresponding to the region A20 of the embodiment sample is presented as B20.

Figure 16:
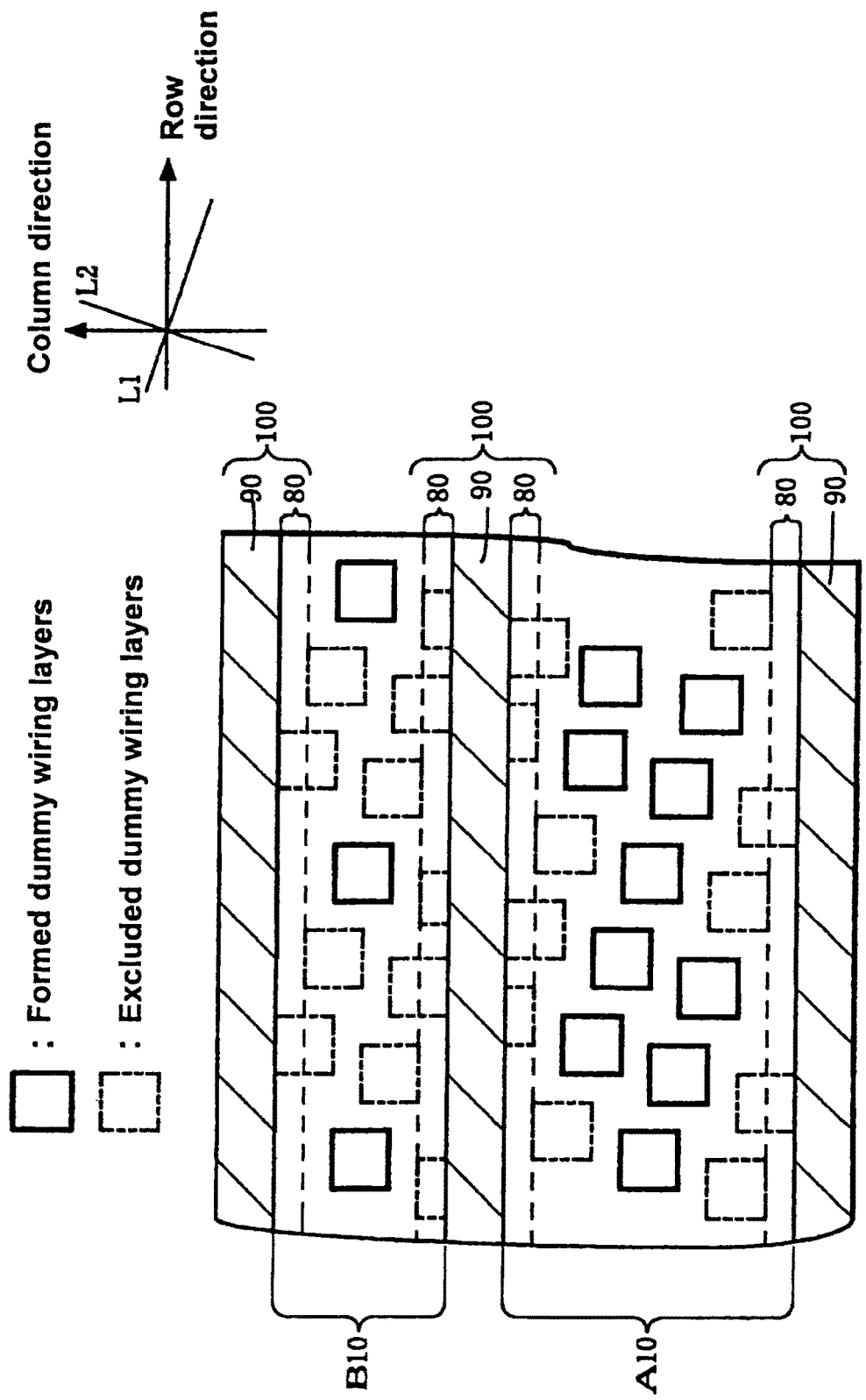
FIG. 16 shows a plan view of wiring layers and dummy wiring layers in an embodiment sample.
Figure 17:
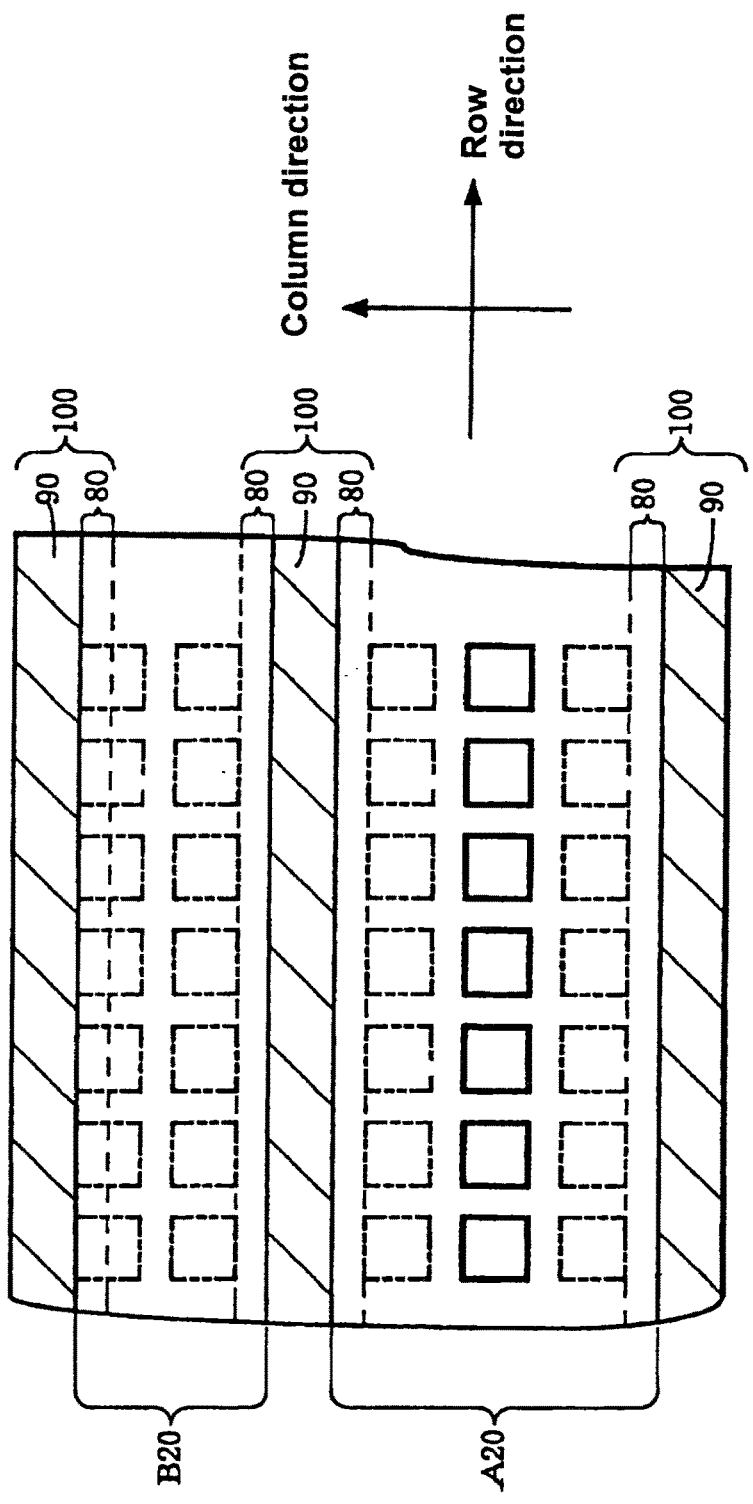
FIG. 17 shows a plan view of wiring layers and dummy wiring layers in a comparison sample.
Figure 18:
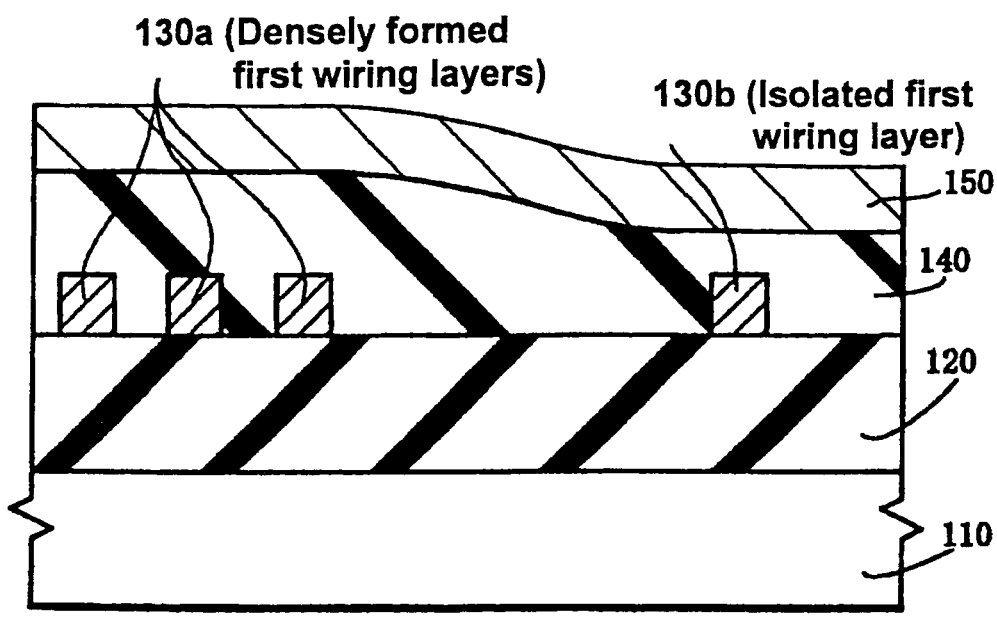
FIG. 18 schematically shows a cross section of a semiconductor device having multiple wiring layers in a manufacturing step using a conventional multiple layer wiring technique.
Figure 19:
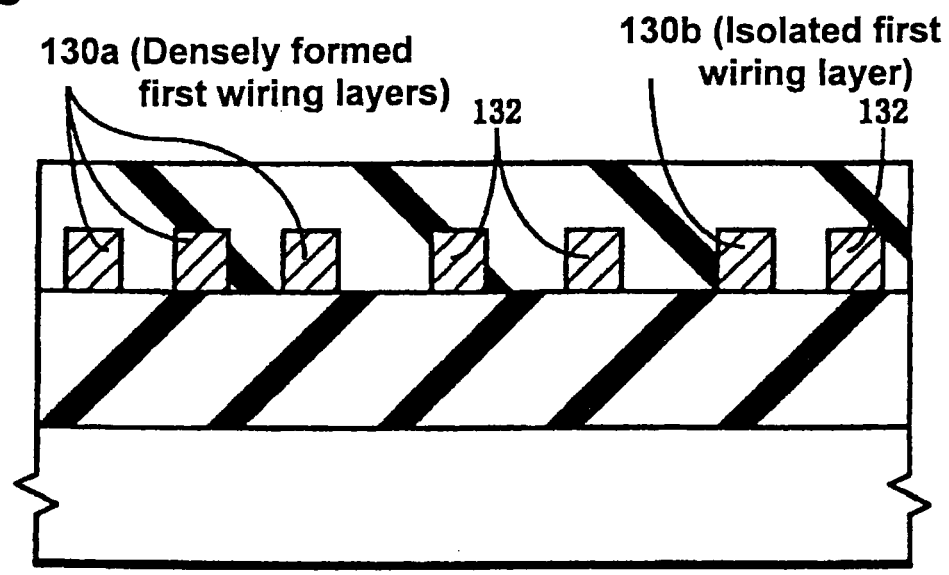
FIG. 19 schematically shows a cross section of a semiconductor device having multiple wiring layers in which dummy wiring layers are also formed.

Comparison results are shown in FIGS. 16 and 17. FIG. 16 shows a plan view of wiring effective regions (wiring layers) and dummy wiring layers of the embodiment sample of the present invention. FIG. 17 shows a plan view of wiring effective regions (wiring layers) and dummy wiring layers of the comparison sample. In the figures, squares shown by solid lines indicate dummy wiring layers that are actually formed, and squares shown by broken lines indicate virtual dummy wiring layers that are excluded.

In the comparison example shown in FIG. 17, only one line of the dummy wiring layers is formed in the region A20. In other words, dummy wiring layers are not formed adjacent to the restriction regions 100. In contrast, as shown in FIG. 16, in accordance with the embodiment of the present invention, the dummy wiring layers are securely formed in the region A10 in areas adjacent to the restriction regions 100.

Also, in the embodiment sample of the present invention shown in FIG. 16, the dummy wiring layers are formed in an area where the gap between the wiring effective regions (i.e., the wiring layers) is narrow (see the region B10). In contrast, in the comparison example shown in FIG. 17, dummy wiring layers are not formed in an area where the gap between the wiring effective regions (i.e., the wiring layers) is narrow (see the region B20).

It is understood from the above that the embodiment sample of the present invention more securely form dummy wiring layers adjacent to restriction regions 100 compared to the comparison example.

The present invention is not limited to the embodiments described above, and many modifications can be made within the scope of the subject matter of the present invention.

(1) In the embodiments described above, the dummy wiring layers 32 are formed in a manner that their centers are disposed on the first virtual linear lines L1. However, the dummy wiring layers 32 may be formed in a manner that portions other than their centers are disposed on the first virtual linear lines L1. In other words, it is acceptable if the dummy wiring layers 32 may be disposed on the first virtual linear lines L1.

(2) In the embodiments described above, the dummy wiring layers 32 are formed in a manner that their centers are disposed on the second virtual linear lines L2. However, the dummy wiring layers 32 may be formed in a manner that portions other than the centers of the dummy wiring layers 32 are disposed on the second virtual linear lines L2. In other words, it is acceptable if the dummy wiring layers 32 may be disposed on the second virtual linear lines L2.

(3) In the embodiments described above, the dummy wiring layers 32 are formed over the first interlayer dielectric layer 20. However, the present invention is not limited to this embodiment. The dummy wiring layers 32 may be formed over a second interlayer dielectric layer or above.

(4) In the embodiments described above, the second contact hole 70 formed in the first interlayer dielectric layer 20 and the second interlayer dielectric layer 40 defines a wiring effective region. However, the present invention is not limited to this embodiment. For contact holes that pass through a plurality of interlayer dielectric layers, wiring effective regions for the contact holes may be defined in a wiring layer provided between the plurality of interlayer dielectric layers. In other words, for example, when an upper wiring layer is formed in a layer above dummy wiring layers, another lower wiring layer is formed in a layer below the dummy wiring layers, and a contact hole for connecting the upper wiring layer and the lower wring layer, a region where the contact hole is formed is defined as a wiring effective region at the level where the dummy wiring layers are formed.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A multilayer semiconductor device comprising:
a plurality of first wirings extending in a first direction, the plurality of first wirings are arranged adjacent to each other in a second direction on a layer level;
a second wiring that is apart from the plurality of first wirings in the second direction on the layer level; and
a plurality of dummy wirings arranged between the plurality of first wirings and the second wiring on the layer level, wherein the plurality of dummy wirings are arranged at a plurality of crossing points between first virtual linear lines extending in a third direction and second virtual linear lines extending in a fourth direction, wherein:
the third direction and the fourth direction are neither parallel nor orthogonal to the first direction and the second direction,
the plurality of dummy wirings having:
a first dummy wiring;
a second dummy wiring; and
a third dummy wiring, wherein centers of the second dummy wiring and the third dummy wiring are nearest to a center of the first dummy wiring relative to others of the plurality of dummy wirings, and
the respective centers of the first dummy wiring, the second dummy wiring, and the third dummy wiring are aligned on a third virtual linear line extending in a fifth direction neither parallel to nor perpendicular to the first direction and the second direction.

2. The semiconductor device according to claim 1, the plurality of dummy wirings having:
a fourth dummy wiring;
a fifth dummy wiring, wherein centers of the fourth dummy wiring and the fifth dummy wiring are nearest to a center of the first dummy wiring relative to other of the plurality of dummy wirings;
wherein respective centers of the first dummy wiring, the fourth dummy wiring, and the fifth dummy wiring are aligned on a fourth virtual linear line extending in a fifth direction neither parallel to nor perpendicular to the first direction and the second direction.

3. The semiconductor device according to claim 2, wherein an angle between the third virtual linear line and the first direction is the same as an angle between the fourth virtual linear line and the second direction.

4. The semiconductor device according to claim 3, wherein the angle between the third virtual linear line and the first direction is between 2 and 40°.

5. The semiconductor device according to claim 3, wherein the angle between the third virtual linear line and the first direction is between 15 and 25°.

6. The semiconductor device according to claim 2, wherein an angle between the fourth virtual linear line and the second direction is between 2 and 40°.

7. The semiconductor device according to claim 2, wherein an angle between the fourth virtual linear line and the second direction is between 15 and 25°.

8. The semiconductor device according to claim 2, wherein the fourth virtual linear line is perpendicular to the third virtual linear line.

9. The semiconductor device according to claim 1, wherein an angle between the third virtual linear line and the first direction is between 2 and 40°.

10. The semiconductor device of according to claim 1, wherein an angle between the third virtual linear line and the first direction is between 15 and 25°.

11. The semiconductor device according to claim 1, wherein the dummy wirings are square-shaped in a plan view.

12. The semiconductor device according to claim 1, wherein the dummy wirings have a square shape in a plan view.

13. The semiconductor device according to claim 1, wherein each of the dummy wirings has a first side, a second side parallel to the first side, a third side perpendicular to the first side, and a fourth side parallel to the third side, and
wherein the first side, the second side, the third side, and the fourth side are the same length.

* * * * *